US007898273B2

(12) United States Patent
Gleason et al.

(10) Patent No.: US 7,898,273 B2
(45) Date of Patent: *Mar. 1, 2011

(54) PROBE FOR TESTING A DEVICE UNDER TEST

(75) Inventors: K. Reed Gleason, Portland, OR (US); Tim Lesher, Portland, OR (US); Mike Andrews, Cornelius, OR (US); John Martin, Portland, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 7 days.

This patent is subject to a terminal disclaimer.

(21) Appl. No.: 12/378,659

(22) Filed: Feb. 17, 2009

(65) Prior Publication Data

US 2009/0267625 A1 Oct. 29, 2009

Related U.S. Application Data

(63) Continuation of application No. 11/975,476, filed on Oct. 19, 2007, now Pat. No. 7,498,829, which is a continuation of application No. 11/888,957, filed on Aug. 3, 2007, now Pat. No. 7,394,269, which is a continuation of application No. 11/391,895, filed on Mar. 28, 2006, now Pat. No. 7,271,603, which is a continuation of application No. 10/445,174, filed on May 23, 2003, now Pat. No. 7,057,404.

(51) Int. Cl.
*G01R 31/20* (2006.01)
(52) U.S. Cl. ............................. 324/754.03; 324/754.06
(58) Field of Classification Search ........................ None
See application file for complete search history.

(56) References Cited

U.S. PATENT DOCUMENTS

| 491,783 A | 2/1893 | Moyer |
| 1,337,866 A | 4/1920 | Whitacker |
| 2,142,625 A | 1/1939 | Zoethout |
| 2,376,101 A | 5/1945 | Tyzzer |
| 2,389,668 A | 11/1945 | Johnson |
| 2,545,258 A | 3/1951 | Cailloux |
| 2,762,234 A | 9/1952 | Dodd |
| 2,901,696 A | 8/1959 | Möllfors |
| 2,921,276 A | 1/1960 | Fubini |
| 2,947,939 A | 8/1960 | Harwig |
| 3,176,091 A | 11/1962 | Hanson et al. |
| 3,111,699 A | 11/1963 | Comeau |

(Continued)

FOREIGN PATENT DOCUMENTS

CH 607 045 11/1978

(Continued)

OTHER PUBLICATIONS

Cohn, S, "Properties of Ridge Wave Guide," Proceedings of the I.R.E., Aug. 1947, pp. 783-788.

(Continued)

*Primary Examiner*—Vinh P Nguyen
(74) *Attorney, Agent, or Firm*—Chernoff, Vilhauer, McClung & Stenzel

(57) ABSTRACT

A probe measurement system for measuring the electrical characteristics of integrated circuits or other microelectronic devices at high frequencies.

29 Claims, 4 Drawing Sheets

U.S. PATENT DOCUMENTS

| | | |
|---|---|---|
| 3,193,712 A | 7/1965 | Harris |
| 3,218,584 A | 11/1965 | Ayer |
| 3,230,299 A | 1/1966 | Radziekowski |
| 3,262,593 A | 7/1966 | Hainer |
| 3,396,598 A | 8/1968 | Grispo |
| 3,401,126 A | 9/1968 | Miller et al. |
| 3,429,040 A | 2/1969 | Miller |
| 3,445,770 A | 5/1969 | Harmon |
| 3,484,679 A | 12/1969 | Hodgson et al. |
| 3,541,222 A | 11/1970 | Park et al. |
| 3,561,280 A | 2/1971 | MacPhee et al. |
| 3,573,617 A | 4/1971 | Randolph et al. |
| 3,596,228 A | 7/1971 | Reed et al. |
| 3,609,539 A | 9/1971 | Gunthert |
| 3,611,199 A | 10/1971 | Safran |
| 3,619,780 A | 11/1971 | Hoeks |
| 3,622,915 A | 11/1971 | Davo |
| 3,634,807 A | 1/1972 | Grobe et al. |
| 3,648,169 A | 3/1972 | Wiesler |
| 3,654,585 A | 4/1972 | Wickersham |
| 3,662,318 A | 5/1972 | Decuyper |
| 3,680,037 A | 7/1972 | Nellis et al. |
| 3,686,624 A | 8/1972 | Napoli et al. |
| 3,700,998 A | 10/1972 | Lee et al. |
| 3,705,379 A | 12/1972 | Bogar |
| 3,710,251 A | 1/1973 | Hagge et al. |
| 3,714,572 A | 1/1973 | Ham et al. |
| 3,725,829 A | 4/1973 | Brown |
| 3,740,900 A | 6/1973 | Youmans et al. |
| 3,766,470 A | 10/1973 | Hay et al. |
| 3,803,709 A | 4/1974 | Beltz et al. |
| 3,806,801 A | 4/1974 | Bove |
| 3,810,016 A | 5/1974 | Chayka et al. |
| 3,829,076 A | 8/1974 | Sofy |
| 3,833,852 A | 9/1974 | Schoch |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,866,093 A | 2/1975 | Kusters et al. |
| 3,867,698 A | 2/1975 | Beltz et al. |
| 3,882,597 A | 5/1975 | Chayka et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,976,959 A | 8/1976 | Gaspari |
| 3,992,073 A | 11/1976 | Buchoff et al. |
| 4,001,685 A | 1/1977 | Roch |
| 4,008,900 A | 2/1977 | Khoshaba |
| 4,009,456 A | 2/1977 | Hopfer |
| 4,027,935 A | 6/1977 | Byrnes et al. |
| 4,035,723 A | 7/1977 | Kvaternik |
| 4,038,599 A | 7/1977 | Bove et al. |
| 4,038,894 A | 8/1977 | Knibbe et al. |
| 4,049,252 A | 9/1977 | Bell |
| 4,063,195 A | 12/1977 | Abrams et al. |
| 4,066,943 A | 1/1978 | Roch |
| 4,072,576 A | 2/1978 | Arwin et al. |
| 4,074,201 A | 2/1978 | Lennon |
| 4,093,988 A | 6/1978 | Scott |
| 4,099,120 A | 7/1978 | Aksu |
| 4,115,735 A | 9/1978 | Stanford |
| 4,116,523 A | 9/1978 | Coberly |
| 4,123,706 A | 10/1978 | Roch |
| 4,124,787 A | 11/1978 | Aamoth et al. |
| 4,135,131 A | 1/1979 | Larsen et al. |
| 4,151,465 A | 4/1979 | Lenz |
| 4,161,692 A | 7/1979 | Tarzwell |
| 4,177,421 A | 12/1979 | Thornburg |
| 4,184,133 A | 1/1980 | Gehle |
| 4,184,729 A | 1/1980 | Parks et al. |
| 4,216,467 A | 8/1980 | Colston |
| 4,225,819 A | 9/1980 | Grau et al. |
| 4,232,398 A | 11/1980 | Gould et al. |
| 4,251,772 A | 2/1981 | Worsham et al. |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Tshirch et al. |
| 4,287,473 A | 9/1981 | Sawyer |
| 4,302,146 A | 11/1981 | Finlayson et al. |
| 4,306,235 A | 12/1981 | Christmann |
| 4,312,117 A | 1/1982 | Robillard et al. |
| 4,327,180 A | 4/1982 | Chen |
| 4,330,783 A | 5/1982 | Toia |
| 4,340,860 A | 7/1982 | Teeple, Jr. |
| 4,346,355 A | 8/1982 | Tsukii |
| 4,357,575 A | 11/1982 | Uren et al. |
| 4,375,631 A | 3/1983 | Goldberg |
| 4,376,920 A | 3/1983 | Smith |
| 4,383,217 A | 5/1983 | Shiell |
| 4,401,945 A | 8/1983 | Juengel |
| 4,425,395 A | 1/1984 | Negishi et al. |
| 4,453,142 A | 6/1984 | Murphy |
| 4,468,629 A | 8/1984 | Choma, Jr. |
| 4,476,363 A | 10/1984 | Berggren et al. |
| 4,480,223 A | 10/1984 | Aigo |
| 4,487,996 A | 12/1984 | Rabinowitz et al. |
| 4,491,783 A | 1/1985 | Sawayama et al. |
| 4,502,028 A | 2/1985 | Leake |
| 4,515,133 A | 5/1985 | Roman |
| 4,515,439 A | 5/1985 | Esswein |
| 4,520,314 A | 5/1985 | Asch et al. |
| 4,528,504 A | 7/1985 | Thornton, Jr. et al. |
| 4,531,474 A | 7/1985 | Inuta |
| 4,551,747 A | 11/1985 | Gilbert et al. |
| 4,552,033 A | 11/1985 | Marzhauser |
| 4,553,111 A | 11/1985 | Barrow |
| 4,558,609 A | 12/1985 | Kim |
| 4,563,640 A | 1/1986 | Hasegawa |
| 4,567,321 A | 1/1986 | Harayama |
| 4,567,436 A | 1/1986 | Koch |
| 4,568,890 A | 2/1986 | Bates |
| 4,581,679 A | 4/1986 | Smolley |
| 4,588,950 A | 5/1986 | Henley |
| 4,589,815 A | 5/1986 | Smith |
| 4,593,243 A | 6/1986 | Lao et al. |
| 4,600,907 A | 7/1986 | Grellman et al. |
| 4,621,169 A | 11/1986 | Petinelli et al. |
| 4,626,618 A | 12/1986 | Takaoka et al. |
| 4,626,805 A | 12/1986 | Jones |
| 4,636,722 A | 1/1987 | Ardezzone |
| 4,636,772 A | 1/1987 | Yasunaga |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,652,082 A | 3/1987 | Warner |
| 4,653,174 A | 3/1987 | Gilder et al. |
| 4,663,840 A | 5/1987 | Ubbens et al. |
| 4,669,805 A | 6/1987 | Kosugi et al. |
| 4,673,839 A | 6/1987 | Veenendaal |
| 4,684,883 A | 8/1987 | Ackerman et al. |
| 4,684,884 A | 8/1987 | Soderlund |
| 4,685,150 A | 8/1987 | Maier |
| 4,691,163 A | 9/1987 | Blass et al. |
| 4,696,544 A | 9/1987 | Costella |
| 4,697,143 A | 9/1987 | Lockwood et al. |
| 4,705,447 A | 11/1987 | Smith |
| 4,706,050 A | 11/1987 | Andrews |

| | | | | | |
|---|---|---|---|---|---|
| 4,707,657 A | 11/1987 | Bøegh-Petersen | 4,970,386 A | 11/1990 | Buck |
| 4,711,563 A | 12/1987 | Lass | 4,972,073 A | 11/1990 | Lessing |
| 4,713,347 A | 12/1987 | Mitchell et al. | 4,975,638 A | 12/1990 | Evans et al. |
| 4,714,873 A | 12/1987 | McPherson et al. | 4,980,637 A | 12/1990 | Huff et al. |
| 4,720,690 A * | 1/1988 | Popek et al. .................... 333/1 | 4,980,638 A | 12/1990 | Dermon et al. |
| 4,722,846 A | 2/1988 | Abe et al. | 4,983,910 A | 1/1991 | Majidi-Ahy et al. |
| 4,725,793 A | 2/1988 | Igarashi | 4,987,100 A | 1/1991 | McBride et al. |
| 4,727,319 A | 2/1988 | Shahriary | 4,988,062 A | 1/1991 | London |
| 4,727,391 A | 2/1988 | Tajima et al. | 4,991,290 A | 2/1991 | MacKay |
| 4,727,637 A | 3/1988 | Buckwitz et al. | 4,998,062 A | 3/1991 | Ikeda |
| 4,734,641 A | 3/1988 | Byrd, Jr. et al. | 4,998,063 A | 3/1991 | Miller |
| 4,739,259 A | 4/1988 | Hadwin et al. | 5,001,423 A | 3/1991 | Abrami et al. |
| 4,740,764 A | 4/1988 | Gerlack | 5,003,253 A | 3/1991 | Majidi-Ahy et al. |
| 4,742,571 A | 5/1988 | Letron | 5,007,163 A | 4/1991 | Pope et al. |
| 4,744,041 A | 5/1988 | Strunk et al. | 5,012,186 A | 4/1991 | Gleason |
| 4,746,857 A | 5/1988 | Sakai et al. | 5,020,219 A | 6/1991 | Leedy |
| 4,749,942 A | 6/1988 | Sang et al. | 5,021,186 A | 6/1991 | Ota et al. |
| 4,754,239 A | 6/1988 | Sedivec | 5,030,907 A | 7/1991 | Yih et al. |
| 4,755,742 A | 7/1988 | Agoston et al. | 5,041,782 A | 8/1991 | Marzan |
| 4,755,746 A | 7/1988 | Mallory et al. | 5,045,781 A | 9/1991 | Gleason et al. |
| 4,755,747 A | 7/1988 | Sato | 5,059,898 A | 10/1991 | Barsotti et al. |
| 4,755,872 A | 7/1988 | Bestler et al. | 5,061,192 A | 10/1991 | Chapin et al. |
| 4,755,874 A | 7/1988 | Esrig et al. | 5,061,823 A | 10/1991 | Carroll |
| 4,757,255 A | 7/1988 | Margozzi | 5,066,357 A | 11/1991 | Smyth, Jr. et al. |
| 4,764,723 A | 8/1988 | Strid | 5,069,628 A | 12/1991 | Crumly |
| 4,766,384 A | 8/1988 | Kleinberg et al. | 5,082,627 A | 1/1992 | Stanbro |
| 4,772,846 A | 9/1988 | Reeds | 5,084,671 A | 1/1992 | Miyata et al. |
| 4,780,670 A | 10/1988 | Cherry | 5,089,774 A | 2/1992 | Nakano |
| 4,783,625 A | 11/1988 | Harry et al. | 5,091,692 A | 2/1992 | Ohno et al. |
| 4,788,851 A | 12/1988 | Brault | 5,091,732 A | 2/1992 | Mileski et al. |
| 4,791,363 A | 12/1988 | Logan | 5,095,891 A | 3/1992 | Reitter |
| 4,793,814 A | 12/1988 | Zifcak et al. | 5,097,101 A | 3/1992 | Trobough |
| 4,795,962 A | 1/1989 | Yanagawa et al. | 5,097,207 A | 3/1992 | Blanz |
| 4,805,627 A | 2/1989 | Klingenbeck et al. | 5,101,453 A | 3/1992 | Rumbaugh |
| 4,810,981 A | 3/1989 | Herstein | 5,107,076 A | 4/1992 | Bullock et al. |
| 4,812,754 A | 3/1989 | Tracy et al. | 5,116,180 A | 5/1992 | Fung et al. |
| 4,818,059 A | 4/1989 | Kakii et al. | 5,126,286 A | 6/1992 | Chance |
| 4,827,211 A | 5/1989 | Strid et al. | 5,126,696 A | 6/1992 | Grote et al. |
| 4,831,494 A | 5/1989 | Arnold et al. | 5,128,612 A | 7/1992 | Aton et al. |
| 4,835,495 A | 5/1989 | Simonutti | 5,129,006 A | 7/1992 | Hill et al. |
| 4,837,507 A | 6/1989 | Hechtman | 5,133,119 A | 7/1992 | Afshari et al. |
| 4,839,587 A | 6/1989 | Flatley et al. | 5,134,365 A | 7/1992 | Okubo et al. |
| 4,849,689 A | 7/1989 | Gleason et al. | 5,136,237 A | 8/1992 | Smith et al. |
| 4,851,767 A | 7/1989 | Halbout et al. | 5,138,289 A | 8/1992 | McGrath |
| 4,853,624 A | 8/1989 | Rabjohn | 5,142,224 A | 8/1992 | Smith et al. |
| 4,853,627 A | 8/1989 | Gleason et al. | 5,145,552 A | 9/1992 | Yoshizawa et al. |
| 4,858,160 A | 8/1989 | Strid et al. | 5,148,131 A | 9/1992 | Amboss et al. |
| 4,859,989 A | 8/1989 | McPherson | 5,159,264 A | 10/1992 | Anderson |
| 4,864,227 A | 9/1989 | Sato | 5,159,267 A | 10/1992 | Anderson |
| 4,871,883 A | 10/1989 | Guiol | 5,159,752 A | 11/1992 | Mahant-Shetti et al. |
| 4,871,964 A | 10/1989 | Boll et al. | 5,160,883 A | 11/1992 | Blanz |
| 4,888,550 A | 12/1989 | Reid | 5,164,319 A | 11/1992 | Hafeman et al. |
| 4,891,584 A | 1/1990 | Kamieniecki et al. | 5,166,606 A | 11/1992 | Blanz |
| 4,893,914 A | 1/1990 | Hancock et al. | 5,170,930 A | 12/1992 | Dolbear et al. |
| 4,894,612 A | 1/1990 | Drake et al. | 5,172,049 A | 12/1992 | Kiyokawa et al. |
| 4,899,126 A | 2/1990 | Yamada | 5,172,050 A | 12/1992 | Swapp |
| 4,899,998 A | 2/1990 | Feramachi | 5,172,051 A | 12/1992 | Zamborelli |
| 4,901,012 A | 2/1990 | Gloanec et al. | 5,177,438 A | 1/1993 | Littlebury et al. |
| 4,904,933 A | 2/1990 | Snyder et al. | 5,180,977 A | 1/1993 | Huff |
| 4,904,935 A | 2/1990 | Calma et al. | 5,187,443 A | 2/1993 | Bereskin |
| 4,906,920 A | 3/1990 | Huff et al. | 5,198,752 A | 3/1993 | Miyata et al. |
| 4,908,570 A | 3/1990 | Gupta et al. | 5,198,753 A | 3/1993 | Hamburgen |
| 4,912,399 A | 3/1990 | Greub et al. | 5,202,558 A | 4/1993 | Barker |
| 4,916,002 A | 4/1990 | Carver | 5,202,648 A | 4/1993 | McCandless |
| 4,916,398 A | 4/1990 | Rath | 5,207,585 A | 5/1993 | Byrnes et al. |
| 4,918,373 A | 4/1990 | Newberg | 5,214,243 A | 5/1993 | Johnson |
| 4,918,383 A | 4/1990 | Huff et al. | 5,214,374 A | 5/1993 | St. Onge |
| 4,922,128 A | 5/1990 | Dhong et al. | 5,221,895 A | 6/1993 | Janko et al. |
| 4,922,186 A | 5/1990 | Tsuchiya et al. | 5,225,037 A | 7/1993 | Elder et al. |
| 4,922,912 A | 5/1990 | Watanabe | 5,227,730 A | 7/1993 | King et al. |
| 4,926,172 A | 5/1990 | Gorsek | 5,232,789 A | 8/1993 | Platz et al. |
| 4,929,893 A | 5/1990 | Sato et al. | 5,233,197 A | 8/1993 | Bowman et al. |
| 4,965,514 A | 10/1990 | Herrick | 5,233,306 A | 8/1993 | Misra |

| | | | | | |
|---|---|---|---|---|---|
| 5,245,292 A | 9/1993 | Milesky et al. | 5,511,010 A | 4/1996 | Burns |
| 5,266,889 A | 11/1993 | Harwood et al. | 5,512,835 A | 4/1996 | Rivera et al. |
| 5,266,963 A | 11/1993 | Carter | 5,517,126 A | 5/1996 | Yamaguchi |
| 5,267,088 A | 11/1993 | Nomura | 5,521,518 A | 5/1996 | Higgins |
| 5,270,664 A | 12/1993 | McMurty et al. | 5,521,522 A | 5/1996 | Abe et al. |
| 5,274,336 A | 12/1993 | Crook et al. | 5,523,694 A | 6/1996 | Cole, Jr. |
| 5,280,156 A | 1/1994 | Niori et al. | 5,528,158 A | 6/1996 | Sinsheimer et al. |
| 5,281,364 A | 1/1994 | Stirling et al. | 5,530,372 A | 6/1996 | Lee et al. |
| 5,289,117 A | 2/1994 | Van Loan et al. | 5,531,022 A | 7/1996 | Beaman et al. |
| 5,293,175 A | 3/1994 | Hemmie et al. | 5,532,608 A | 7/1996 | Behfar-Rad et al. |
| 5,298,972 A | 3/1994 | Heffner | 5,537,372 A | 7/1996 | Albrecht et al. |
| 5,304,924 A | 4/1994 | Yamano et al. | 5,539,323 A | 7/1996 | Davis, Jr. |
| 5,308,250 A | 5/1994 | Walz | 5,539,676 A | 7/1996 | Yamaguchi |
| 5,313,157 A | 5/1994 | Pasiecznik, Jr. | 5,550,481 A | 8/1996 | Holmes et al. |
| 5,315,237 A | 5/1994 | Iwakura et al. | 5,561,378 A | 10/1996 | Bockelman et al. |
| 5,316,435 A | 5/1994 | Mozingo | 5,563,522 A | 10/1996 | Abe |
| 5,317,656 A | 5/1994 | Moslehi et al. | 5,565,788 A | 10/1996 | Burr et al. |
| 5,321,352 A | 6/1994 | Takebuchi | 5,565,881 A | 10/1996 | Phillips et al. |
| 5,321,453 A | 6/1994 | Mori et al. | 5,569,591 A | 10/1996 | Kell et al. |
| 5,326,412 A | 7/1994 | Schreiber et al. | 5,571,324 A | 11/1996 | Sago et al. |
| 5,334,931 A | 8/1994 | Clarke et al. | 5,578,932 A | 11/1996 | Adamian |
| 5,347,204 A | 9/1994 | Gregory et al. | 5,583,445 A | 12/1996 | Mullen |
| 5,355,079 A | 10/1994 | Evans et al. | 5,584,120 A | 12/1996 | Roberts |
| 5,357,211 A | 10/1994 | Bryson et al. | 5,584,608 A | 12/1996 | Gillespie |
| 5,360,312 A | 11/1994 | Mozingo | 5,589,781 A | 12/1996 | Higgens et al. |
| 5,361,049 A | 11/1994 | Rubin et al. | 5,594,358 A | 1/1997 | Ishikawa et al. |
| 5,363,050 A | 11/1994 | Guo et al. | 5,600,256 A | 2/1997 | Woith et al. |
| 5,367,165 A | 11/1994 | Toda et al. | 5,601,740 A | 2/1997 | Eldridge et al. |
| 5,369,368 A | 11/1994 | Kassen et al. | 5,610,529 A | 3/1997 | Schwindt |
| 5,371,654 A | 12/1994 | Beaman et al. | 5,611,008 A | 3/1997 | Yap |
| 5,373,231 A | 12/1994 | Boll et al. | 5,617,035 A | 4/1997 | Swapp |
| 5,374,938 A | 12/1994 | Hatazawa et al. | 5,621,333 A | 4/1997 | Long et al. |
| 5,376,790 A | 12/1994 | Linker et al. | 5,621,400 A | 4/1997 | Corbi |
| 5,383,787 A | 1/1995 | Switky et al. | 5,623,213 A | 4/1997 | Liu et al. |
| 5,389,885 A | 2/1995 | Swart | 5,623,214 A | 4/1997 | Pasiecznik, Jr. |
| 5,395,253 A | 3/1995 | Crumly | 5,627,473 A | 5/1997 | Takami |
| 5,397,855 A | 3/1995 | Ferlier | 5,628,057 A | 5/1997 | Phillips et al. |
| 5,404,111 A | 4/1995 | Mori et al. | 5,629,838 A | 5/1997 | Knight et al. |
| 5,408,188 A | 4/1995 | Katoh | 5,631,571 A | 5/1997 | Spaziani et al. |
| 5,408,189 A | 4/1995 | Swart et al. | 5,633,780 A | 5/1997 | Cronin |
| 5,412,330 A | 5/1995 | Ravel et al. | 5,635,846 A | 6/1997 | Beaman et al. |
| 5,412,866 A | 5/1995 | Woith et al. | 5,642,298 A | 6/1997 | Mallory et al. |
| 5,414,565 A | 5/1995 | Sullivan et al. | 5,644,248 A | 7/1997 | Fujimoto |
| 5,422,574 A | 6/1995 | Kister | 5,653,939 A | 8/1997 | Hollis et al. |
| 5,430,813 A | 7/1995 | Anderson et al. | 5,656,942 A | 8/1997 | Watts et al. |
| 5,441,690 A | 8/1995 | Ayala-Esquilin et al. | 5,659,421 A | 8/1997 | Rahmel et al. |
| 5,451,884 A | 9/1995 | Sauerland | 5,666,063 A | 9/1997 | Abercrombie et al. |
| 5,453,404 A | 9/1995 | Leedy | 5,669,316 A | 9/1997 | Faz et al. |
| 5,457,398 A | 10/1995 | Schwindt et al. | 5,670,322 A | 9/1997 | Eggers et al. |
| 5,463,324 A | 10/1995 | Wardwell et al. | 5,670,888 A | 9/1997 | Cheng |
| 5,467,024 A | 11/1995 | Swapp | 5,672,816 A | 9/1997 | Park et al. |
| 5,469,324 A | 11/1995 | Henderson et al. | 5,675,499 A | 10/1997 | Lee et al. |
| 5,471,185 A | 11/1995 | Shea et al. | 5,675,932 A | 10/1997 | Mauney |
| 5,475,316 A | 12/1995 | Hurley et al. | 5,676,360 A | 10/1997 | Boucher et al. |
| 5,476,211 A | 12/1995 | Khandros | 5,678,210 A | 10/1997 | Hannah |
| 5,477,011 A | 12/1995 | Singles et al. | 5,685,232 A | 11/1997 | Inoue |
| 5,478,748 A | 12/1995 | Akins, Jr. et al. | 5,686,317 A | 11/1997 | Akram et al. |
| 5,479,108 A | 12/1995 | Cheng | 5,686,960 A | 11/1997 | Sussman et al. |
| 5,479,109 A | 12/1995 | Lau et al. | 5,688,618 A | 11/1997 | Hulderman et al. |
| 5,481,196 A | 1/1996 | Nosov | 5,700,844 A | 12/1997 | Hederick et al. |
| 5,481,936 A | 1/1996 | Yanagisawa | 5,704,355 A | 1/1998 | Bridges |
| 5,487,999 A | 1/1996 | Farnworth | 5,715,819 A | 2/1998 | Svenson et al. |
| 5,488,954 A | 2/1996 | Sleva et al. | 5,720,098 A | 2/1998 | Kister |
| 5,491,425 A | 2/1996 | Watanabe et al. | 5,723,347 A | 3/1998 | Kirano et al. |
| 5,493,070 A | 2/1996 | Habu | 5,726,211 A | 3/1998 | Hedrick et al. |
| 5,493,236 A | 2/1996 | Ishii et al. | 5,728,091 A | 3/1998 | Payne et al. |
| 5,500,606 A | 3/1996 | Holmes | 5,729,150 A | 3/1998 | Schwindt |
| 5,505,150 A | 4/1996 | James et al. | 5,731,920 A | 3/1998 | Katsuragawa |
| 5,506,498 A | 4/1996 | Anderson et al. | 5,742,174 A | 4/1998 | Kister et al. |
| 5,506,515 A | 4/1996 | Godshalk et al. | 5,744,971 A | 4/1998 | Chan et al. |
| 5,507,652 A | 4/1996 | Wardwell | 5,748,506 A | 5/1998 | Bockelman |
| 5,508,630 A | 4/1996 | Klemer et al. | 5,751,153 A | 5/1998 | Bockelman |
| 5,510,792 A | 4/1996 | Ono et al. | 5,751,252 A | 5/1998 | Phillips |

| | | | | | |
|---|---|---|---|---|---|
| 5,756,021 A | 5/1998 | Bedrick et al. | 5,963,364 A | 10/1999 | Leong et al. |
| 5,756,908 A | 5/1998 | Knollmeyer et al. | 5,966,645 A | 10/1999 | Davis |
| 5,764,070 A | 6/1998 | Pedder | 5,970,429 A | 10/1999 | Martin |
| 5,767,690 A | 6/1998 | Fujimoto | 5,973,504 A | 10/1999 | Chong |
| 5,772,451 A | 6/1998 | Dozier, II et al. | 5,974,662 A | 11/1999 | Eldridge et al. |
| 5,773,780 A | 6/1998 | Eldridge et al. | 5,977,783 A | 11/1999 | Takayama et al. |
| 5,777,485 A | 7/1998 | Tanaka et al. | 5,981,268 A | 11/1999 | Kovacs et al. |
| 5,785,538 A | 7/1998 | Beaman et al. | 5,982,166 A | 11/1999 | Mautz |
| 5,792,668 A | 8/1998 | Fuller et al. | 5,983,493 A | 11/1999 | Eldridge et al. |
| 5,793,213 A | 8/1998 | Bockelman et al. | 5,993,611 A | 11/1999 | Moroney, III et al. |
| 5,794,133 A | 8/1998 | Kashima | 5,994,152 A | 11/1999 | Khandros et al. |
| 5,803,607 A | 9/1998 | Jones et al. | 5,995,914 A | 11/1999 | Cabot |
| 5,804,607 A | 9/1998 | Hedrick et al. | 5,996,102 A | 11/1999 | Haulin |
| 5,804,982 A | 9/1998 | Lo et al. | 5,998,228 A | 12/1999 | Eldridge et al. |
| 5,804,983 A | 9/1998 | Nakajima et al. | 5,998,768 A | 12/1999 | Hunter et al. |
| 5,806,181 A | 9/1998 | Khandros et al. | 5,998,864 A | 12/1999 | Khandros et al. |
| 5,807,107 A | 9/1998 | Bright et al. | 5,999,268 A | 12/1999 | Yonezawa et al. |
| 5,808,874 A | 9/1998 | Smith | 6,001,760 A | 12/1999 | Katsuda et al. |
| 5,810,607 A | 9/1998 | Shih et al. | 6,002,426 A | 12/1999 | Back et al. |
| 5,811,751 A | 9/1998 | Leona et al. | 6,006,002 A | 12/1999 | Motok et al. |
| 5,811,982 A | 9/1998 | Beaman et al. | 6,013,586 A | 1/2000 | McGhee et al. |
| 5,813,847 A | 9/1998 | Eroglu et al. | 6,019,612 A | 2/2000 | Hasegawa et al. |
| 5,814,847 A | 9/1998 | Shihadeh et al. | 6,023,103 A | 2/2000 | Chang et al. |
| 5,820,014 A | 10/1998 | Dozier, II et al. | 6,028,435 A | 2/2000 | Nikawa |
| 5,821,763 A | 10/1998 | Beaman et al. | 6,029,344 A | 2/2000 | Khandros et al. |
| 5,824,494 A | 10/1998 | Feldberg | 6,031,383 A | 2/2000 | Streib et al. |
| 5,829,128 A | 11/1998 | Eldridge et al. | 6,032,356 A | 3/2000 | Eldridge et al. |
| 5,829,437 A | 11/1998 | Bridges | 6,032,714 A | 3/2000 | Fenton |
| 5,831,442 A | 11/1998 | Heigl | 6,033,935 A | 3/2000 | Dozier, II et al. |
| 5,832,601 A | 11/1998 | Eldridge et al. | 6,034,533 A | 3/2000 | Tervo et al. |
| 5,833,601 A | 11/1998 | Swartz et al. | 6,037,785 A | 3/2000 | Higgins |
| 5,838,160 A | 11/1998 | Beaman et al. | 6,040,739 A | 3/2000 | Wedeen et al. |
| 5,841,288 A | 11/1998 | Meaney et al. | 6,042,712 A | 3/2000 | Mathieu |
| 5,841,342 A | 11/1998 | Hegmann et al. | 6,043,563 A | 3/2000 | Eldridge et al. |
| 5,846,708 A | 12/1998 | Hollis et al. | 6,046,599 A | 4/2000 | Long et al. |
| 5,847,569 A | 12/1998 | Ho et al. | 6,049,216 A | 4/2000 | Yang et al. |
| 5,848,500 A | 12/1998 | Kirk | 6,049,976 A | 4/2000 | Khandros |
| 5,852,232 A | 12/1998 | Samsavar et al. | 6,050,829 A | 4/2000 | Eldridge et al. |
| 5,852,871 A | 12/1998 | Khandros | 6,051,422 A | 4/2000 | Kovacs et al. |
| 5,854,608 A | 12/1998 | Leisten | 6,052,653 A | 4/2000 | Mazur et al. |
| 5,864,946 A | 2/1999 | Eldridge et al. | 6,054,651 A | 4/2000 | Fogel et al. |
| 5,867,073 A | 2/1999 | Weinreb et al. | 6,054,869 A | 4/2000 | Hutton et al. |
| 5,869,326 A | 2/1999 | Hofmann | 6,059,982 A | 5/2000 | Palagonia et al. |
| 5,869,974 A | 2/1999 | Akram et al. | 6,060,888 A | 5/2000 | Blackham et al. |
| 5,874,361 A | 2/1999 | Collins et al. | 6,060,892 A | 5/2000 | Yamagata |
| 5,876,082 A | 3/1999 | Kempf et al. | 6,061,589 A | 5/2000 | Bridges et al. |
| 5,878,486 A | 3/1999 | Eldridge et al. | 6,062,879 A | 5/2000 | Beaman et al. |
| 5,879,289 A | 3/1999 | Yarush et al. | 6,064,213 A | 5/2000 | Khandros et al. |
| 5,883,522 A | 3/1999 | O'Boyle | 6,064,217 A | 5/2000 | Smith |
| 5,883,523 A | 3/1999 | Ferland et al. | 6,064,218 A | 5/2000 | Godfrey et al. |
| 5,884,398 A | 3/1999 | Eldridge et al. | 6,066,911 A | 5/2000 | Lindemann et al. |
| 5,888,075 A | 3/1999 | Hasegawa et al. | 6,071,009 A | 6/2000 | Clyne |
| 5,892,539 A | 4/1999 | Colvin | 6,078,183 A | 6/2000 | Cole, Jr. |
| 5,896,038 A | 4/1999 | Budnaitis et al. | 6,078,500 A | 6/2000 | Beaman et al. |
| 5,900,737 A | 5/1999 | Graham et al. | 6,090,261 A | 7/2000 | Mathieu |
| 5,900,738 A | 5/1999 | Khandros et al. | 6,091,236 A | 7/2000 | Piety et al. |
| 5,903,143 A | 5/1999 | Mochizuki et al. | 6,091,255 A | 7/2000 | Godfrey |
| 5,905,421 A | 5/1999 | Oldfield | 6,091,256 A | 7/2000 | Long et al. |
| 5,910,727 A | 6/1999 | Fujihara et al. | 6,096,561 A | 8/2000 | Tayi |
| 5,912,046 A | 6/1999 | Eldridge et al. | 6,096,567 A | 8/2000 | Kaplan et al. |
| 5,914,613 A | 6/1999 | Gleason et al. | 6,100,815 A | 8/2000 | Pailthorp |
| 5,914,614 A | 6/1999 | Beaman et al. | 6,104,201 A | 8/2000 | Beaman et al. |
| 5,916,689 A | 6/1999 | Collins et al. | 6,104,206 A | 8/2000 | Verkull |
| 5,917,707 A | 6/1999 | Khandros et al. | 6,110,823 A | 8/2000 | Eldridge et al. |
| 5,923,180 A | 7/1999 | Botka et al. | 6,114,864 A | 9/2000 | Soejima et al. |
| 5,926,029 A | 7/1999 | Ference et al. | 6,114,865 A | 9/2000 | Lagowski et al. |
| 5,926,951 A | 7/1999 | Khandros et al. | 6,118,287 A | 9/2000 | Boll et al. |
| 5,940,965 A | 8/1999 | Uhling et al. | 6,118,894 A | 9/2000 | Schwartz et al. |
| 5,944,093 A | 8/1999 | Viswanath | 6,121,836 A | 9/2000 | Vallencourt |
| 5,945,836 A | 8/1999 | Sayre et al. | 6,124,725 A | 9/2000 | Sato |
| 5,949,383 A | 9/1999 | Hayes et al. | 6,127,831 A | 10/2000 | Khoury et al. |
| 5,949,579 A | 9/1999 | Baker | 6,130,536 A | 10/2000 | Powell et al. |
| 5,959,461 A | 9/1999 | Brown et al. | 6,137,302 A | 10/2000 | Schwindt |

| | | | |
|---|---|---|---|
| 6,144,212 A | 11/2000 | Mizuta | |
| 6,146,908 A | 11/2000 | Falque et al. | |
| 6,147,502 A | 11/2000 | Fryer et al. | |
| 6,147,851 A | 11/2000 | Anderson | |
| 6,150,186 A | 11/2000 | Chen et al. | |
| 6,160,407 A | 12/2000 | Nikawa | |
| 6,166,553 A | 12/2000 | Sinsheimer | |
| 6,168,974 B1 | 1/2001 | Chang et al. | |
| 6,169,410 B1 | 1/2001 | Grace et al. | |
| 6,172,337 B1 | 1/2001 | Johnsgard et al. | |
| 6,174,744 B1 | 1/2001 | Watanabe et al. | |
| 6,175,228 B1 | 1/2001 | Zamborelli et al. | |
| 6,176,091 B1 | 1/2001 | Kishi et al. | |
| 6,181,144 B1 | 1/2001 | Hembree et al. | |
| 6,181,149 B1 | 1/2001 | Godfrey et al. | |
| 6,181,297 B1 | 1/2001 | Leisten | |
| 6,181,416 B1 | 1/2001 | Falk | |
| 6,184,053 B1 | 2/2001 | Eldridge et al. | |
| 6,184,587 B1 | 2/2001 | Khandros et al. | |
| 6,184,845 B1 | 2/2001 | Leisten et al. | |
| 6,191,596 B1 | 2/2001 | Abiko | |
| 6,194,720 B1 | 2/2001 | Li et al. | |
| 6,201,453 B1 | 3/2001 | Chan et al. | |
| 6,206,273 B1 | 3/2001 | Beaman et al. | |
| 6,208,225 B1 | 3/2001 | Miller | |
| RE37,130 E | 4/2001 | Fiori, Jr. | |
| 6,211,663 B1 | 4/2001 | Moulthrop et al. | |
| 6,211,837 B1 | 4/2001 | Crouch et al. | |
| 6,215,196 B1 | 4/2001 | Eldridge et al. | |
| 6,215,295 B1 | 4/2001 | Smith, III | |
| 6,215,670 B1 | 4/2001 | Khandros | |
| 6,218,910 B1 | 4/2001 | Miller | |
| 6,222,031 B1 | 4/2001 | Wakabayashi et al. | |
| 6,222,970 B1 | 4/2001 | Wach et al. | |
| 6,229,327 B1 | 5/2001 | Boll et al. | |
| 6,232,149 B1 | 5/2001 | Dozier, II et al. | |
| 6,232,787 B1 | 5/2001 | Lo et al. | |
| 6,232,788 B1 | 5/2001 | Schwindt et al. | |
| 6,232,789 B1 | 5/2001 | Schwindt | |
| 6,233,613 B1 | 5/2001 | Walker et al. | |
| 6,236,223 B1 | 5/2001 | Brady et al. | |
| 6,242,803 B1 | 6/2001 | Khandros et al. | |
| 6,242,929 B1 | 6/2001 | Mizuta | |
| 6,245,692 B1 | 6/2001 | Pearce et al. | |
| 6,246,247 B1 | 6/2001 | Eldridge et al. | |
| 6,251,595 B1 | 6/2001 | Gordon et al. | |
| 6,255,126 B1 | 7/2001 | Mathiue et al. | |
| 6,256,882 B1 | 7/2001 | Gleason et al. | |
| 6,257,564 B1 | 7/2001 | Avneri et al. | |
| 6,257,565 B1 | 7/2001 | Houston et al. | |
| 6,259,260 B1 | 7/2001 | Smith et al. | |
| 6,265,950 B1 | 7/2001 | Schmidt et al. | |
| 6,268,015 B1 | 7/2001 | Mathieu et al. | |
| 6,268,016 B1 | 7/2001 | Bhatt et al. | |
| 6,271,673 B1 | 8/2001 | Furuta et al. | |
| 6,274,823 B1 | 8/2001 | Khandros et al. | |
| 6,275,043 B1 | 8/2001 | Mühlberger et al. | |
| 6,275,738 B1 | 8/2001 | Kasevich et al. | |
| 6,278,051 B1 | 8/2001 | Peabody | |
| 6,278,411 B1 | 8/2001 | Ohlsson et al. | |
| 6,281,691 B1 | 8/2001 | Matsunaga et al. | |
| 6,286,208 B1 | 9/2001 | Shih et al. | |
| 6,292,760 B1 | 9/2001 | Burns | |
| 6,295,729 B1 | 10/2001 | Beaman et al. | |
| 6,300,775 B1 | 10/2001 | Peach et al. | |
| 6,300,780 B1 | 10/2001 | Beaman et al. | |
| 6,307,161 B1 | 10/2001 | Grube et al. | |
| 6,307,363 B1 | 10/2001 | Anderson | |
| 6,307,672 B1 | 10/2001 | DeNure | |
| 6,310,483 B1 | 10/2001 | Taura et al. | |
| 6,320,372 B1 | 11/2001 | Keller | |
| 6,320,396 B1 | 11/2001 | Nikawa | |
| 6,327,034 B1 | 12/2001 | Hoover et al. | |
| 6,329,827 B1 | 12/2001 | Beaman et al. | |
| 6,330,164 B1 | 12/2001 | Khandros et al. | |
| 6,332,270 B2 | 12/2001 | Beaman et al. | |
| 6,334,247 B1 | 1/2002 | Beaman et al. | |
| 6,335,625 B1 | 1/2002 | Bryant et al. | |
| 6,339,338 B1 | 1/2002 | Eldridge et al. | |
| 6,340,568 B2 | 1/2002 | Hefti | |
| 6,340,895 B1 | 1/2002 | Uher et al. | |
| 6,351,885 B2 | 3/2002 | Suzuki et al. | |
| 6,352,454 B1 | 3/2002 | Kim et al. | |
| 6,359,456 B1 | 3/2002 | Hembree et al. | |
| 6,362,792 B1 | 3/2002 | Sawamura et al. | |
| 6,366,247 B1 | 4/2002 | Sawamura et al. | |
| 6,369,776 B1 | 4/2002 | Leisten et al. | |
| 6,376,258 B2 | 4/2002 | Hefti | |
| 6,384,614 B1 | 5/2002 | Hager et al. | |
| 6,384,615 B2 | 5/2002 | Schwindt | |
| 6,388,455 B1 | 5/2002 | Kamieniecki et al. | |
| 6,395,480 B1 | 5/2002 | Hefti | |
| 6,396,296 B1 | 5/2002 | Tarter et al. | |
| 6,396,298 B1 | 5/2002 | Young et al. | |
| 6,400,168 B2 | 6/2002 | Matsunaga et al. | |
| 6,404,213 B2 | 6/2002 | Noda | |
| 6,407,542 B1 | 6/2002 | Conte | |
| 6,407,562 B1 | 6/2002 | Whiteman | |
| 6,409,724 B1 | 6/2002 | Penney et al. | |
| 6,414,478 B1 | 7/2002 | Suzuki | |
| 6,415,858 B1 | 7/2002 | Getchel et al. | |
| 6,418,009 B1 | 7/2002 | Brunette | |
| 6,420,722 B2 | 7/2002 | Moore et al. | |
| 6,424,316 B1 | 7/2002 | Leisten | |
| 6,429,029 B1 | 8/2002 | Eldridge et al. | |
| 6,441,315 B1 | 8/2002 | Eldridge et al. | |
| 6,442,831 B1 | 9/2002 | Khandros et al. | |
| 6,447,339 B1 | 9/2002 | Reed et al. | |
| 6,448,788 B1 | 9/2002 | Meaney et al. | |
| 6,448,865 B1 | 9/2002 | Miller | |
| 6,452,406 B1 | 9/2002 | Beaman et al. | |
| 6,452,411 B1 | 9/2002 | Miller et al. | |
| 6,456,099 B1 | 9/2002 | Eldridge et al. | |
| 6,456,103 B1 | 9/2002 | Eldridge et al. | |
| 6,459,343 B1 | 10/2002 | Miller | |
| 6,459,739 B1 | 10/2002 | Vitenberg | |
| 6,468,098 B1 | 10/2002 | Eldridge | |
| 6,475,822 B2 | 11/2002 | Eldridge | |
| 6,476,333 B1 | 11/2002 | Khandros et al. | |
| 6,476,442 B1 | 11/2002 | Williams et al. | |
| 6,476,630 B1 | 11/2002 | Whitten et al. | |
| 6,479,308 B1 | 11/2002 | Eldridge | |
| 6,480,013 B1 | 11/2002 | Nayler et al. | |
| 6,480,978 B1 | 11/2002 | Roy et al. | |
| 6,481,939 B1 | 11/2002 | Gillespie et al. | |
| 6,482,013 B2 | 11/2002 | Eldridge et al. | |
| 6,483,327 B1 | 11/2002 | Bruce et al. | |
| 6,488,405 B1 | 12/2002 | Eppes et al. | |
| 6,490,471 B2 | 12/2002 | Svenson et al. | |
| 6,491,968 B1 | 12/2002 | Mathieu et al. | |
| 6,496,024 B1 | 12/2002 | Schwindt | |
| 6,499,121 B1 | 12/2002 | Roy et al. | |
| 6,501,343 B2 | 12/2002 | Miller | |
| 6,509,751 B1 | 1/2003 | Mathieu et al. | |
| 6,512,482 B1 | 1/2003 | Nelson et al. | |
| 6,520,778 B1 | 2/2003 | Eldridge et al. | |
| 6,525,555 B1 | 2/2003 | Khandros et al. | |
| 6,526,655 B2 | 3/2003 | Beaman et al. | |
| 6,528,984 B2 | 3/2003 | Beaman et al. | |
| 6,528,993 B1 | 3/2003 | Shin et al. | |
| 6,529,844 B1 | 3/2003 | Kapetanic et al. | |
| 6,534,856 B1 | 3/2003 | Dozier, II et al. | |
| 6,538,214 B2 | 3/2003 | Khandros | |
| 6,538,538 B2 | 3/2003 | Hreish et al. | |
| 6,539,531 B2 | 3/2003 | Miller et al. | |
| 6,548,311 B1 | 4/2003 | Knoll | |

| | | | | | | |
|---|---|---|---|---|---|---|
| 6,549,022 | B1 | 4/2003 | Cole, Jr. et al. | 6,727,716 | B1 | 4/2004 | Sharif |
| 6,549,106 | B2 | 4/2003 | Martin | 6,729,019 | B2 | 5/2004 | Grube et al. |
| 6,551,884 | B2 | 4/2003 | Masuoka | 6,731,804 | B2 | 5/2004 | Carrieri et al. |
| 6,559,671 | B2 | 5/2003 | Miller et al. | 6,734,687 | B1 | 5/2004 | Ishitani et al. |
| 6,566,079 | B2 | 5/2003 | Hefti | 6,737,920 | B2 | 5/2004 | Jen et al. |
| 6,572,608 | B1 | 6/2003 | Lee et al. | 6,741,085 | B1 | 5/2004 | Khandros et al. |
| 6,573,702 | B2 | 6/2003 | Marcuse et al. | 6,741,092 | B2 | 5/2004 | Eldridge et al. |
| 6,578,264 | B1 | 6/2003 | Gleason et al. | 6,741,129 | B1 | 5/2004 | Corsi et al. |
| 6,580,283 | B1 | 6/2003 | Carbone et al. | 6,744,268 | B2 | 6/2004 | Hollman |
| 6,582,979 | B2 | 6/2003 | Coccioli et al. | 6,753,679 | B1 | 6/2004 | Kwong et al. |
| 6,587,327 | B1 | 7/2003 | Devoe et al. | 6,753,699 | B2 | 6/2004 | Stockstad |
| 6,597,187 | B2 | 7/2003 | Eldridge et al. | 6,759,311 | B2 | 7/2004 | Eldridge et al. |
| 6,603,322 | B1 | 8/2003 | Boll et al. | 6,759,859 | B2 | 7/2004 | Deng et al. |
| 6,603,323 | B1 | 8/2003 | Miller et al. | 6,764,869 | B2 | 7/2004 | Eldridge et al. |
| 6,603,324 | B2 | 8/2003 | Eldridge et al. | 6,768,328 | B2 | 7/2004 | Self et al. |
| 6,605,941 | B2 | 8/2003 | Abe | 6,770,955 | B1 | 8/2004 | Coccioli et al. |
| 6,605,951 | B1 | 8/2003 | Cowan | 6,771,806 | B1 | 8/2004 | Satya et al. |
| 6,605,955 | B1 | 8/2003 | Costello et al. | 6,777,319 | B2 | 8/2004 | Grube et al. |
| 6,606,014 | B2 | 8/2003 | Miller | 6,778,140 | B1 | 8/2004 | Yeh |
| 6,606,575 | B2 | 8/2003 | Miller | 6,778,406 | B2 | 8/2004 | Eldridge et al. |
| 6,608,494 | B1 | 8/2003 | Bruce et al. | 6,780,001 | B2 | 8/2004 | Eldridge et al. |
| 6,611,417 | B2 | 8/2003 | Chen | 6,784,674 | B2 | 8/2004 | Miller |
| 6,615,485 | B2 | 9/2003 | Eldridge et al. | 6,784,677 | B2 | 8/2004 | Miller |
| 6,616,966 | B2 | 9/2003 | Mathieu et al. | 6,784,679 | B2 | 8/2004 | Sweet et al. |
| 6,617,862 | B1 | 9/2003 | Bruce | 6,788,093 | B2 | 9/2004 | Aitren et al. |
| 6,617,866 | B1 | 9/2003 | Ickes | 6,788,094 | B2 | 9/2004 | Khandros et al. |
| 6,621,082 | B2 | 9/2003 | Morita et al. | 6,791,176 | B2 | 9/2004 | Mathieu et al. |
| 6,621,260 | B2 | 9/2003 | Eldridge et al. | 6,794,888 | B2 | 9/2004 | Kawaguchi et al. |
| 6,622,103 | B1 | 9/2003 | Miller | 6,794,934 | B2 | 9/2004 | Betti-Berutto et al. |
| 6,624,648 | B2 | 9/2003 | Eldridge et al. | 6,794,950 | B2 | 9/2004 | Du Toit et al. |
| 6,627,461 | B2 | 9/2003 | Chapman et al. | 6,798,225 | B2 | 9/2004 | Miller |
| 6,627,483 | B2 | 9/2003 | Ondricek et al. | 6,798,226 | B2 | 9/2004 | Altmann et al. |
| 6,627,980 | B2 | 9/2003 | Eldridge | 6,806,724 | B2 | 10/2004 | Hayden et al. |
| 6,628,503 | B2 | 9/2003 | Sogard | 6,806,836 | B2 | 10/2004 | Ogawa et al. |
| 6,628,980 | B2 | 9/2003 | Atalar et al. | 6,807,734 | B2 | 10/2004 | Eldridge et al. |
| 6,633,174 | B1 | 10/2003 | Satya et al. | 6,809,533 | B1 | 10/2004 | Anlage et al. |
| 6,636,182 | B2 | 10/2003 | Mehltretter | 6,811,406 | B2 | 11/2004 | Grube |
| 6,639,461 | B1 | 10/2003 | Tam et al. | 6,812,691 | B2 | 11/2004 | Miller |
| 6,640,415 | B2 | 11/2003 | Eslamy et al. | 6,812,718 | B1 | 11/2004 | Chong et al. |
| 6,640,432 | B1 | 11/2003 | Mathieu et al. | 6,815,963 | B2 | 11/2004 | Gleason et al. |
| 6,642,625 | B2 | 11/2003 | Dozier, II et al. | 6,816,031 | B1 | 11/2004 | Miller |
| 6,643,597 | B1 | 11/2003 | Dunsmore | 6,816,840 | B1 | 11/2004 | Goodwin, III |
| 6,644,982 | B1 | 11/2003 | Ondricek et al. | 6,817,052 | B2 | 11/2004 | Grube |
| 6,646,520 | B2 | 11/2003 | Miller | 6,818,840 | B2 | 11/2004 | Khandros |
| 6,653,903 | B2 | 11/2003 | Leich et al. | 6,822,463 | B1 | 11/2004 | Jacobs |
| 6,655,023 | B1 | 12/2003 | Eldridge et al. | 6,822,529 | B2 | 11/2004 | Miller |
| 6,657,455 | B2 | 12/2003 | Eldridge et al. | 6,825,052 | B2 | 11/2004 | Eldridge et al. |
| 6,657,601 | B2 | 12/2003 | McLean | 6,825,422 | B2 | 11/2004 | Eldridge et al. |
| 6,661,316 | B2 | 12/2003 | Hreish et al. | 6,827,582 | B2 | 12/2004 | Morris et al. |
| 6,664,628 | B2 | 12/2003 | Khandros et al. | 6,827,584 | B2 | 12/2004 | Mathieu et al. |
| 6,669,489 | B1 | 12/2003 | Dozier, II et al. | 6,835,898 | B2 | 12/2004 | Eldridge et al. |
| 6,672,875 | B1 | 1/2004 | Mathieu et al. | 6,836,962 | B2 | 1/2005 | Khandros et al. |
| 6,677,744 | B1 | 1/2004 | Long | 6,838,885 | B2 | 1/2005 | Kamitani |
| 6,678,850 | B2 | 1/2004 | Roy et al. | 6,838,893 | B2 | 1/2005 | Khandros et al. |
| 6,678,876 | B2 | 1/2004 | Stevens et al. | 6,839,964 | B2 | 1/2005 | Henson |
| 6,680,659 | B2 | 1/2004 | Miller | 6,845,491 | B2 | 1/2005 | Miller et al. |
| 6,685,817 | B1 | 2/2004 | Mathieu | 6,850,082 | B2 | 2/2005 | Schwindt |
| 6,686,754 | B2 | 2/2004 | Miller | 6,856,129 | B2 | 2/2005 | Thomas et al. |
| 6,690,185 | B1 | 2/2004 | Khandros et al. | 6,856,150 | B2 | 2/2005 | Sporck et al. |
| 6,701,265 | B2 | 3/2004 | Hill et al. | 6,862,727 | B2 | 3/2005 | Stevens |
| 6,701,612 | B2 | 3/2004 | Khandros et al. | 6,864,105 | B2 | 3/2005 | Grube et al. |
| 6,707,548 | B2 | 3/2004 | Kreimer et al. | 6,864,694 | B2 | 3/2005 | McTigue |
| 6,708,403 | B2 | 3/2004 | Beaman et al. | 6,870,359 | B1 | 3/2005 | Sekel |
| 6,710,798 | B1 | 3/2004 | Hershel et al. | 6,870,381 | B2 | 3/2005 | Grube |
| 6,713,374 | B2 | 3/2004 | Eldridge et al. | 6,882,239 | B2 | 4/2005 | Miller |
| 6,714,828 | B2 | 3/2004 | Eldridge et al. | 6,882,546 | B2 | 4/2005 | Miller |
| 6,717,426 | B2 | 4/2004 | Iwasaki | 6,887,723 | B1 | 5/2005 | Ondricek et al. |
| 6,720,501 | B1 | 4/2004 | Henson | 6,888,362 | B2 | 5/2005 | Eldridge et al. |
| 6,722,032 | B2 | 4/2004 | Beaman et al. | 6,891,385 | B2 | 5/2005 | Miller |
| 6,724,205 | B1 | 4/2004 | Hayden et al. | 6,900,646 | B2 | 5/2005 | Kasukabe et al. |
| 6,724,928 | B2 | 4/2004 | Davis | 6,900,647 | B2 | 5/2005 | Yoshida et al. |
| 6,727,579 | B2 | 4/2004 | Eldridge et al. | 6,900,652 | B2 | 5/2005 | Mazur |
| 6,727,580 | B1 | 4/2004 | Eldridge et al. | 6,900,653 | B2 | 5/2005 | Yu et al. |

| | | | | | | |
|---|---|---|---|---|---|---|
| 6,902,416 B2 | 6/2005 | Feldman | | 7,009,188 B2 | 3/2006 | Wang |
| 6,902,941 B2 | 6/2005 | Sun | | 7,009,383 B2 | 3/2006 | Harwood et al. |
| 6,903,563 B2 | 6/2005 | Yoshida et al. | | 7,009,415 B2 | 3/2006 | Kobayashi et al. |
| 6,906,506 B1 | 6/2005 | Reano et al. | | 7,011,531 B2 | 3/2006 | Egitto et al. |
| 6,906,539 B2 | 6/2005 | Wilson et al. | | 7,012,425 B2 | 3/2006 | Shoji |
| 6,906,542 B2 | 6/2005 | Sakagawa et al. | | 7,012,441 B2 | 3/2006 | Chou et al. |
| 6,906,543 B2 | 6/2005 | Lou et al. | | 7,013,221 B1 | 3/2006 | Friend et al. |
| 6,907,149 B2 | 6/2005 | Slater | | 7,014,499 B2 | 3/2006 | Yoon |
| 6,908,364 B2 | 6/2005 | Back et al. | | 7,015,455 B2 | 3/2006 | Mitsuoka et al. |
| 6,909,297 B2 | 6/2005 | Ji et al. | | 7,015,689 B2 | 3/2006 | Kasajima et al. |
| 6,909,300 B2 | 6/2005 | Lu et al. | | 7,015,690 B2 | 3/2006 | Wang et al. |
| 6,909,983 B2 | 6/2005 | Sutherland | | 7,015,703 B2 | 3/2006 | Hopkins et al. |
| 6,910,268 B2 | 6/2005 | Miller | | 7,015,707 B2 | 3/2006 | Cherian |
| 6,911,814 B2 | 6/2005 | Miller et al. | | 7,015,708 B2 | 3/2006 | Beckous et al. |
| 6,911,826 B2 | 6/2005 | Plotnikov et al. | | 7,015,709 B2 | 3/2006 | Capps et al. |
| 6,911,834 B2 | 6/2005 | Mitchell et al. | | 7,015,710 B2 | 3/2006 | Yoshida et al. |
| 6,911,835 B2 | 6/2005 | Chraft et al. | | 7,015,711 B2 | 3/2006 | Rothaug et al. |
| 6,912,468 B2 | 6/2005 | Marin et al. | | 7,019,541 B2 | 3/2006 | Kittrell |
| 6,913,468 B2 | 7/2005 | Dozier, II et al. | | 7,019,544 B1 | 3/2006 | Jacobs et al. |
| 6,914,244 B2 | 7/2005 | Alani | | 7,019,701 B2 | 3/2006 | Ohno et al. |
| 6,914,427 B2 | 7/2005 | Gifford et al. | | 7,020,360 B2 | 3/2006 | Satomura et al. |
| 6,914,430 B2 | 7/2005 | Hasegawa et al. | | 7,020,363 B2 | 3/2006 | Johannessen |
| 6,914,580 B2 | 7/2005 | Leisten | | 7,022,976 B1 | 4/2006 | Santana, Jr. et al. |
| 6,917,195 B2 | 7/2005 | Hollman | | 7,022,985 B2 | 4/2006 | Knebel et al. |
| 6,917,210 B2 | 7/2005 | Miller | | 7,023,225 B2 | 4/2006 | Blackwood |
| 6,917,211 B2 | 7/2005 | Yoshida et al. | | 7,023,226 B2 | 4/2006 | Okumura et al. |
| 6,917,525 B2 | 7/2005 | Mok et al. | | 7,023,231 B2 | 4/2006 | Howland, Jr. et al. |
| 6,919,732 B2 | 7/2005 | Yoshida et al. | | 7,025,628 B2 | 4/2006 | LaMeres et al. |
| 6,922,069 B2 | 7/2005 | Jun | | 7,026,832 B2 | 4/2006 | Chaya et al. |
| 6,924,653 B2 | 8/2005 | Schaeffer et al. | | 7,026,833 B2 | 4/2006 | Rincon et al. |
| 6,924,655 B2 | 8/2005 | Kirby | | 7,026,834 B2 | 4/2006 | Hwang |
| 6,927,078 B2 | 8/2005 | Saijo et al. | | 7,026,835 B2 | 4/2006 | Farnworth et al. |
| 6,927,079 B1 | 8/2005 | Fyfield | | 7,030,328 B1 | 4/2006 | Beerling |
| 6,927,586 B2 | 8/2005 | Thiessen | | 7,030,599 B2 | 4/2006 | Douglas |
| 6,927,587 B2 | 8/2005 | Yoshioka | | 7,030,827 B2 | 4/2006 | Mahler et al. |
| 6,927,598 B2 | 8/2005 | Lee et al. | | 7,032,307 B2 | 4/2006 | Matsunaga et al. |
| 6,930,498 B2 | 8/2005 | Tervo et al. | | 7,034,553 B2 | 4/2006 | Gilboe |
| 6,933,713 B2 | 8/2005 | Cannon | | 7,035,738 B2 | 4/2006 | Matsumoto et al. |
| 6,933,717 B1 | 8/2005 | Dogaru et al. | | 7,057,404 B2 | 6/2006 | Gleason et al. |
| 6,933,725 B2 | 8/2005 | Lim et al. | | 7,071,722 B2 | 7/2006 | Yamada et al. |
| 6,933,736 B2 | 8/2005 | Kobayashi et al. | | 7,088,981 B2 | 8/2006 | Chang |
| 6,933,737 B2 | 8/2005 | Sugawara | | 7,096,133 B1 | 8/2006 | Martin et al. |
| 6,937,020 B2 | 8/2005 | Munson et al. | | 7,161,363 B2 | 1/2007 | Gleason et al. |
| 6,937,037 B2 | 8/2005 | Eldridge et al. | | 7,173,433 B2 | 2/2007 | Hoshi et al. |
| 6,937,040 B2 | 8/2005 | Maeda et al. | | 7,187,188 B2 | 3/2007 | Andrews et al. |
| 6,937,042 B2 | 8/2005 | Yoshida et al. | | 7,188,037 B2 | 3/2007 | Hidehira |
| 6,937,045 B2 | 8/2005 | Sinclair | | 7,219,416 B2 | 5/2007 | Inoue et al. |
| 6,937,341 B1 | 8/2005 | Woollam et al. | | 7,233,160 B2 | 6/2007 | Hayden et al. |
| 6,940,264 B2 | 9/2005 | Ryken, Jr. et al. | | 7,253,646 B2 | 8/2007 | Lou et al. |
| 6,940,283 B2 | 9/2005 | McQueeney | | 7,271,603 B2 | 9/2007 | Gleason et al. |
| 6,943,563 B2 | 9/2005 | Martens | | 7,276,922 B2 | 10/2007 | Miller et al. |
| 6,943,571 B2 | 9/2005 | Worledge | | 7,315,175 B2 | 1/2008 | Cole |
| 6,943,574 B2 | 9/2005 | Altmann et al. | | 7,319,335 B2 | 1/2008 | Brunner et al. |
| 6,944,380 B1 | 9/2005 | Hideo et al. | | 7,319,337 B2 | 1/2008 | Sakata |
| 6,946,375 B2 | 9/2005 | Hattori et al. | | 7,323,680 B2 | 1/2008 | Chong |
| 6,946,859 B2 | 9/2005 | Karavakis et al. | | 7,323,899 B2 | 1/2008 | Schuette et al. |
| 6,946,860 B2 | 9/2005 | Cheng et al. | | 7,327,153 B2 | 2/2008 | Weinraub |
| 6,946,864 B2 | 9/2005 | Gramann et al. | | 7,332,918 B2 | 2/2008 | Sugiyama et al. |
| 6,948,391 B2 | 9/2005 | Brassell et al. | | 7,332,923 B2 | 2/2008 | Schott et al. |
| 6,948,981 B2 | 9/2005 | Pade | | 7,342,402 B2 | 3/2008 | Kim et al. |
| 6,949,942 B2 | 9/2005 | Eldridge et al. | | 7,403,028 B2 | 7/2008 | Campbell |
| 6,970,001 B2 | 11/2005 | Chheda et al. | | 7,427,868 B2 | 9/2008 | Strid et al. |
| 6,987,483 B2 | 1/2006 | Tran | | 7,498,829 B2 * | 3/2009 | Gleason et al. .............. 324/754 |
| 7,001,785 B1 | 2/2006 | Chen | | 2001/0002794 A1 | 6/2001 | Draving et al. |
| 7,002,133 B2 | 2/2006 | Beausoleil et al. | | 2001/0009061 A1 | 7/2001 | Gleason et al. |
| 7,002,363 B2 | 2/2006 | Mathieu | | 2001/0009377 A1 | 7/2001 | Schwindt et al. |
| 7,002,364 B2 | 2/2006 | Kang et al. | | 2001/0010468 A1 | 8/2001 | Gleason et al. |
| 7,003,184 B2 | 2/2006 | Ronnekleiv et al. | | 2001/0020283 A1 | 9/2001 | Sakaguchi |
| 7,005,842 B2 | 2/2006 | Fink et al. | | 2001/0024116 A1 | 9/2001 | Draving |
| 7,005,868 B2 | 2/2006 | McTigue | | 2001/0030549 A1 | 10/2001 | Gleason et al. |
| 7,005,879 B1 | 2/2006 | Robertazzi | | 2001/0043073 A1 | 11/2001 | Montoya |
| 7,006,046 B2 | 2/2006 | Aisenbrey | | 2001/0044152 A1 | 11/2001 | Burnett |
| 7,007,380 B2 | 3/2006 | Das et al. | | 2001/0045511 A1 | 11/2001 | Moore et al. |

| | | |
|---|---|---|
| 2001/0054906 A1 | 12/2001 | Fujimura |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |
| 2002/0011859 A1 | 1/2002 | Smith et al. |
| 2002/0011863 A1 | 1/2002 | Takahashi et al. |
| 2002/0030480 A1 | 3/2002 | Appen et al. |
| 2002/0050828 A1 | 5/2002 | Seward, IV et al. |
| 2002/0070743 A1 | 6/2002 | Felici et al. |
| 2002/0070745 A1 | 6/2002 | Johnson et al. |
| 2002/0079911 A1 | 6/2002 | Schwindt |
| 2002/0105396 A1 | 8/2002 | Streeter et al. |
| 2002/0109088 A1 | 8/2002 | Nara et al. |
| 2002/0118034 A1 | 8/2002 | Laureanti |
| 2002/0149377 A1 | 10/2002 | Hefti et al. |
| 2002/0153909 A1 | 10/2002 | Petersen et al. |
| 2002/0163769 A1 | 11/2002 | Brown |
| 2002/0168659 A1 | 11/2002 | Hefti et al. |
| 2002/0176160 A1 | 11/2002 | Suzuki et al. |
| 2002/0180466 A1 | 12/2002 | Hiramatsu et al. |
| 2002/0197709 A1 | 12/2002 | van der Weide et al. |
| 2003/0010877 A1 | 1/2003 | Landreville et al. |
| 2003/0030822 A1 | 2/2003 | Finarov |
| 2003/0032000 A1 | 2/2003 | Liu et al. |
| 2003/0040004 A1 | 2/2003 | Hefti et al. |
| 2003/0057513 A1 | 3/2003 | Leedy |
| 2003/0062915 A1 | 4/2003 | Arnold et al. |
| 2003/0072549 A1 | 4/2003 | Facer et al. |
| 2003/0076585 A1 | 4/2003 | Ledley |
| 2003/0077649 A1 | 4/2003 | Cho et al. |
| 2003/0088180 A1 | 5/2003 | Van Veen et al. |
| 2003/0119057 A1 | 6/2003 | Gascoyne et al. |
| 2003/0139662 A1 | 7/2003 | Seidman |
| 2003/0139790 A1 | 7/2003 | Ingle et al. |
| 2003/0155939 A1 | 8/2003 | Lutz et al. |
| 2003/0170898 A1 | 9/2003 | Gunderson et al. |
| 2003/0184332 A1 | 10/2003 | Tomimatsu et al. |
| 2003/0215966 A1 | 11/2003 | Rolda et al. |
| 2003/0234659 A1 | 12/2003 | Zieleman |
| 2004/0015060 A1 | 1/2004 | Samsoondar et al. |
| 2004/0021475 A1 | 2/2004 | Ito et al. |
| 2004/0029425 A1 | 2/2004 | Yean et al. |
| 2004/0061514 A1 | 4/2004 | Schwindt et al. |
| 2004/0066181 A1 | 4/2004 | Theis |
| 2004/0069776 A1 | 4/2004 | Fagrell et al. |
| 2004/0090223 A1 | 5/2004 | Yonezawa |
| 2004/0095145 A1 | 5/2004 | Boudiaf et al. |
| 2004/0095641 A1 | 5/2004 | Russum et al. |
| 2004/0100276 A1 | 5/2004 | Fanton |
| 2004/0100297 A1 | 5/2004 | Tanioka et al. |
| 2004/0108847 A1 | 6/2004 | Stoll et al. |
| 2004/0113640 A1 | 6/2004 | Cooper et al. |
| 2004/0130787 A1 | 7/2004 | Thome-Forster et al. |
| 2004/0132222 A1 | 7/2004 | Hembree et al. |
| 2004/0134899 A1 | 7/2004 | Hiramatsu et al. |
| 2004/0140819 A1 | 7/2004 | McTigue et al. |
| 2004/0147034 A1 | 7/2004 | Gore et al. |
| 2004/0162689 A1 | 8/2004 | Jamneala et al. |
| 2004/0170312 A1 | 9/2004 | Soenksen |
| 2004/0175294 A1 | 9/2004 | Ellison et al. |
| 2004/0186382 A1 | 9/2004 | Modell et al. |
| 2004/0193382 A1 | 9/2004 | Adamian et al. |
| 2004/0197771 A1 | 10/2004 | Powers et al. |
| 2004/0199350 A1 | 10/2004 | Blackham et al. |
| 2004/0201388 A1 | 10/2004 | Barr |
| 2004/0207072 A1 | 10/2004 | Hiramatsu et al. |
| 2004/0207424 A1 | 10/2004 | Hollman |
| 2004/0239338 A1 | 12/2004 | Johnsson et al. |
| 2004/0246004 A1 | 12/2004 | Heuermann |
| 2004/0251922 A1 | 12/2004 | Martens et al. |
| 2005/0024069 A1 | 2/2005 | Hayden et al. |
| 2005/0026276 A1 | 2/2005 | Chou |
| 2005/0030047 A1 | 2/2005 | Adamian |
| 2005/0054029 A1 | 3/2005 | Tomimatsu et al. |
| 2005/0062533 A1 | 3/2005 | Vice |
| 2005/0068054 A1 | 3/2005 | Mok et al. |
| 2005/0083130 A1 | 4/2005 | Grilo |
| 2005/0088191 A1 | 4/2005 | Lesher |
| 2005/0101846 A1 | 5/2005 | Fine et al. |
| 2005/0116730 A1 | 6/2005 | Hsu |
| 2005/0142033 A1 | 6/2005 | Glezer et al. |
| 2005/0151548 A1 | 7/2005 | Hayden et al. |
| 2005/0156675 A1 | 7/2005 | Rohde et al. |
| 2005/0164160 A1 | 7/2005 | Gunter et al. |
| 2005/0165316 A1 | 7/2005 | Lowery et al. |
| 2005/0168722 A1 | 8/2005 | Forstner et al. |
| 2005/0172703 A1 | 8/2005 | Kley |
| 2005/0174191 A1 | 8/2005 | Brunker et al. |
| 2005/0178980 A1 | 8/2005 | Skidmore et al. |
| 2005/0179444 A1 | 8/2005 | Tiemeijer |
| 2005/0184742 A1 | 8/2005 | Huang et al. |
| 2005/0195124 A1 | 9/2005 | Puente Baliarda et al. |
| 2005/0229053 A1 | 10/2005 | Sunter |
| 2005/0236587 A1 | 10/2005 | Kodama et al. |
| 2005/0237102 A1 | 10/2005 | Tanaka |
| 2006/0030060 A1 | 2/2006 | Noguchi et al. |
| 2006/0052075 A1 | 3/2006 | Galivanche et al. |
| 2006/0155270 A1 | 7/2006 | Hancock et al. |
| 2006/0184041 A1 | 8/2006 | Andrews et al. |
| 2006/0220663 A1 | 10/2006 | Oikawa |
| 2006/0226864 A1 | 10/2006 | Kramer |
| 2007/0024506 A1 | 2/2007 | Hardacker |
| 2007/0030021 A1 | 2/2007 | Cowan et al. |
| 2007/0145989 A1 | 6/2007 | Zhu et al. |
| 2008/0111571 A1 | 5/2008 | Smith et al. |

FOREIGN PATENT DOCUMENTS

| | | |
|---|---|---|
| CN | 1083975 | 3/1994 |
| DD | 288234 | 3/1991 |
| DE | 2951072 | 7/1981 |
| DE | 3426565 | 1/1986 |
| DE | 3637549 | 5/1988 |
| DE | 4223658 | 1/1993 |
| DE | 9313420 | 10/1993 |
| DE | 19522774 | 1/1997 |
| DE | 19542955 | 5/1997 |
| DE | 19618717 | 1/1998 |
| DE | 19749687 | 5/1998 |
| DE | 29809568 | 10/1998 |
| DE | 10003282 | 10/2000 |
| DE | 10000324 | 7/2001 |
| DE | 20220754 | 5/2004 |
| EP | 0230766 | 12/1985 |
| EP | 0195520 | 9/1986 |
| EP | 0230348 | 7/1987 |
| EP | 0259163 | 3/1988 |
| EP | 0259183 | 3/1988 |
| EP | 0259942 | 3/1988 |
| EP | 0261986 | 3/1988 |
| EP | 0270422 | 6/1988 |
| EP | 0333521 | 9/1989 |
| EP | 0361779 | 4/1990 |
| EP | 0460911 | 12/1991 |
| EP | 0624801 | 11/1994 |
| EP | 0846476 | 6/1998 |
| EP | 0945736 | 9/1999 |
| FR | 2689327 | 10/1993 |
| GB | 579665 | 8/1946 |
| GB | 2014315 | 8/1979 |
| GB | 2179458 | 3/1987 |
| JP | 52-19046 | 2/1977 |
| JP | 53037077 | 4/1978 |
| JP | 53-052354 | 5/1978 |
| JP | 55115383 | 9/1980 |

| | | |
|---|---|---|
| JP | 56-007439 | 1/1981 |
| JP | 5691503 | 7/1981 |
| JP | 56088333 | 7/1981 |
| JP | 57075480 | 5/1982 |
| JP | 57163035 | 10/1982 |
| JP | 57171805 | 10/1982 |
| JP | 58-130602 | 8/1983 |
| JP | 594189 U | 1/1984 |
| JP | 60-5462 | 4/1984 |
| JP | 60-236241 | 11/1985 |
| JP | 61142802 | 6/1986 |
| JP | 62-11243 | 1/1987 |
| JP | 62-51235 | 3/1987 |
| JP | 62-58650 | 3/1987 |
| JP | 62098634 | 5/1987 |
| JP | 62107937 | 5/1987 |
| JP | 62-179126 | 8/1987 |
| JP | 62239050 | 10/1987 |
| JP | 62295374 | 12/1987 |
| JP | 63-108736 | 5/1988 |
| JP | 63-129640 | 6/1988 |
| JP | 63-143814 | 6/1988 |
| JP | 63-152141 | 6/1988 |
| JP | 63-192246 | 8/1988 |
| JP | 63-318745 | 12/1988 |
| JP | 64-21309 | 2/1989 |
| JP | 1-165968 | 6/1989 |
| JP | 1-214038 | 8/1989 |
| JP | 01209380 | 8/1989 |
| JP | 1-219575 | 9/1989 |
| JP | 1-296167 | 11/1989 |
| JP | 2-22836 | 1/1990 |
| JP | 2-141681 | 5/1990 |
| JP | 02124469 | 5/1990 |
| JP | 02135804 | 5/1990 |
| JP | 2-191352 | 7/1990 |
| JP | 3-175367 | 7/1991 |
| JP | 3196206 | 8/1991 |
| JP | 03228348 | 10/1991 |
| JP | 04130639 | 5/1992 |
| JP | 04159043 | 6/1992 |
| JP | 04206930 | 7/1992 |
| JP | 4-340248 | 11/1992 |
| JP | 05082631 | 4/1993 |
| JP | 5-113451 | 5/1993 |
| JP | 5157790 | 6/1993 |
| JP | 5166893 | 7/1993 |
| JP | 6-71425 | 3/1994 |
| JP | 6-85044 | 3/1994 |
| JP | 6-102313 | 4/1994 |
| JP | 6-132709 | 5/1994 |
| JP | 6-160236 | 6/1994 |
| JP | 6154238 | 6/1994 |
| JP | 6-295949 | 10/1994 |
| JP | 7005078 | 1/1995 |
| JP | 7012871 | 1/1995 |
| JP | 7-201945 | 8/1995 |
| JP | 8035987 | 2/1996 |
| JP | 8-261898 | 10/1996 |
| JP | 08330401 | 12/1996 |
| JP | 09127432 | 5/1997 |
| JP | 10-48256 | 2/1998 |
| JP | 10116866 | 5/1998 |
| JP | 10142260 | 5/1998 |
| JP | 11004001 | 1/1999 |
| JP | 11023975 | 1/1999 |
| JP | 2000-137120 | 5/2000 |
| JP | 2000-329664 | 11/2000 |
| JP | 2001-33633 | 2/2001 |
| JP | 2001-124676 | 5/2001 |
| JP | 2001-189285 | 7/2001 |
| JP | 2001-189378 | 7/2001 |
| JP | 2002-203879 | 7/2002 |
| JP | 2002243502 | 8/2002 |
| JP | 2002/299394 | 10/2002 |
| JP | 2004-507851 | 3/2004 |
| KR | 2003/0090158 | 11/2003 |
| SU | 843040 | 6/1981 |
| SU | 1195402 | 11/1985 |
| SU | 1327023 | 7/1987 |
| SU | 1392603 | 4/1988 |
| WO | WO80/00101 | 1/1980 |
| WO | WO94/10554 | 5/1994 |
| WO | WO 96/29629 | 1/1996 |
| WO | WO 97/50001 | 12/1997 |
| WO | WO98/07040 | 2/1998 |
| WO | WO 00/73905 | 12/2000 |
| WO | WO01/07207 | 2/2001 |
| WO | WO 01/69656 | 9/2001 |
| WO | WO 03/100445 | 12/2003 |
| WO | WO 2004/044604 | 5/2004 |
| WO | WO 2004/065944 | 8/2004 |
| WO | WO 2004/079299 | 9/2004 |
| WO | WO 2005/062025 | 7/2005 |
| WO | WO 2007/145727 | 12/2007 |
| WO | WO 2007/145728 | 12/2007 |

OTHER PUBLICATIONS

Cohn, Seymour B., "Optimum Design of Stepped Transmission-Line Transformers," I.R.E. Transactions—Microwave Theory and Techniques, No. 3, 1955, pp. 16-21.

Hopper, Samuel, "The Design of Ridged Waveguides," I.R.E. Transactions—Microwave Theory and techniques, No. 5, Oct. 1955, pp. 20-29.

Chen, Tsung-Shan, "Calculation of Parameters of Ridge Waveguides," IRE Transactions on Microwave Theory and Techniques, Jan. 1957, pp. 12-17.

IRE 20.1, Committee Personnel, "IRE Standards on Methods of Measuring Noise in Linear Twoports, 1959," Proc. IRE, vol. 48, pp. 60-68, Jan. 1960, pp. 32-40.

Fukui, H., "Available Power Gain, Noise Figure, and Noise Measure of Two-Ports and Their Graphical Representations," pp. 18-23, Reprinted from IEEE Trans. Circuit Theory, vol. CT-13, pp. 137-142, Jun. 1966.

Beaubien, M.J., et al., "An Accurate Finite-Difference Method for Higher Order Waveguide Modes," IEEE Transactions on Microwave Theory and Techniques, vol. M11-16, No. 12, Dec. 1968, pp. 1007-1017.

Lane, Richard Q., "The Determination of Device Noise Parameters," Proc. IEEE, vol. 57, Aug. 1969, pp. 1461-1462.

Adamian, Vaheh, et al., "A Novel Procedure for Receiver Noise Characterization," IEEE Transactions on Instrumentaton and Measurement, Jun. 1973.

Daly, P., "Polar Geometry Waveguides by finite-element Methods," IEEE Transactions on Microwave Theory and Technique, vol. MTT-22, No. 3, Mar. 1974, pp. 202-209.

Fink, Donald G., et al., "Electronics Engineers' Handbook," Sec. 17-52 Measurement and Control Circuits, 1975, pp. 17-22-17-27.

Bry, A., et al, "Bypass Capacitor for Chip Probe," IBM Technical Disclosure Bulletin, vol. 18, No. 11, Apr. 1976.

Skobern, J.R., "Subminiature High-Frequency Probe," IBM Technical disclosure Bulletin, vol. 19, No. 10, Mar. 1977.

Berg, William, et al., "Elastomers solve tough problems in high-frequency systems," 2119 EDN vol. 23, Jan. 5, 1978, pp. 36-42.

Eisenhart, R.L., "A Better Microstrip Connector," 1978 IEEE MTT-S International Microwave Symposium Digest, Jun. 27-29, Ottawa, Canada.

Gommlich, Hans, et al., "Verzerrungsmessungen-Wichtige Aufgabe in der Ubertragungstechnik," Elektronik 8/ Apr. 23, 1982, pp. 110-119.

Larock, V., et al., "Automatic Noise Temperature Measurement Through Frequency Variation," IEEE Transactions on Microwave Theory and Techniques, vol. MTT-30, No. 8, Aug. 1982, pp. 1286-1288.

Maury Microwave Corp., "Transistor Test Fixture (TTF) Inserts, Calibration & Check Devices, MT951, MT952, MT953 Series," Advanced Data 4T-002, Sep. 20, 1982, pp. 1-2.

Maury Microwave Corp., "Transistor Test Fixture (TTF) Software," MT950D Series, Sep. 20, 1982, 2 pages.

Maury Microwave Corp., "Transistor Test Fixture (TTF)," MT950 Series, Advanced data 4T-001, Oct. 7, 1982.

Abbott, D.A., et al., "Automatic noise figure measurements with computer control and correction," 8054 Radio and Electronic Engineer vol. 52, Oct. 1982, pp. 468-474.

Swain, Howard L. et al., "Noise Figure Meter Sets Records for Accuracy, Repeatability, and Convenience," 1266 Hewlett-Packard Journal, vol. 34, No. 4, Apr. 1983, pp. 23-34.

Adamian, V. et al., "Simplified Noise Evaluation of Microwave Receiver," IEEE Transactions on Instrumentation and Measurement, vol. IM-33, No. 2, Jun. 1984, 136-140.

Inter-Continental Microwave, "Product Catalog," VMC 1055 Jan. 1986.

Design Technique, "Microstrip Microwave Test Fixture," May 1986.

Cascade Microtech, Inc., "Wide Probe Assembly," Full Scale Drawing, May 29, 1986, 2 pages.

Jackson, Robert et al., "Surface-to-Surface Transition via Electromagnetic Coupling of Coplanar Waveguides," Nov. 1987, 8099 IEEE Transactions on Microwave Theory and Techniques MTT-35, pp. 1027-1032.

Sharma, A., "Tunable Waveguide-to-Microstrip Transition for Millimeter-Wave Applications," IEE MTT-S Digest 1987, pp. 353-356.

Izadian, Jamal S., "Unified Design Plans Aid Waveguide Transitions," Microwaves & R&F, May 1987, pp. 213-222.

Mazilu, T., "A Self-Adjusting Waveguide-to-Microstrip Transition," Microwave Journal, Jul. 1987, pp. 133-134.

Carlton, D.E. et al., "Accurate Measurement of High-speed Package and Interconnect Parasitics," IEEE 1988 Custom Integrated Circuits Conference, pp. 23.3.1-23.3.6.

Fraser, Artur, et al., "GHz On-Silicon-Wafer Probing Calibration Methods," Paper 7.6, IEEE 1988 Bipolar Circuits & Technology Meeting, pp. 154-157.

Modolo, John A., et al, "Wafer level high-frequency measurements of photodetector characteristics," Applied Optics, vol. 27 pp. 3059-3061, Aug. 1988.

Design Technique, "Adjustable Test Fixture," 1988.

Tong, Peter R., et al., "Noise Measurements at MM-Wave Frequencies," 176 Microwave Journal 31, Jul. 1988.

Barsotti, C., et al., "New Probe Cards Replace Needle Types," Semiconductor International, Aug. 1988, pp. 98-101.

Microwave Journal, "Microwave Products," Sep. 1988, pp. 297.

Cascade Microtech Microprobe Update, "Spurious propagation, modes removed by probe absorber," Apr. 1989.

Esteban, J., et al., "Mode Spectrum of Waveguides Using A Transverse S-Matrix Resonance Method," AP-S International Symposium 1989, IEEE Catalog No. CH-2654-2189, San Jose, CA, Jun. 26-30, 1989, pp. 1263-1267.

Ponchak, George, et al., "A New Rectangular Waveguide to Coplaner Waveguide Transition," Prepared for 1990 IEEE MTT-S International Microwave Symposium to be held between May 8-10, 1990 in Dallas, Texas, Jan. 1990.

Dalman, G.C., "New Waveguide-to-Coplaner Waveguide Transition for Centimetre and Millimetre Wave Applications," Electronics Letters, Jun. 21, 1990, vol. 26, No. 13.

Liu, S.M. Joseph, et al., "A New Probe for W-band On-wafer Measurements," IEEE MTT-S Digest, 1993, pp. 1335-1338.

Photo of Micromanipulator Probe Station, 1994.

Maury Microwave Corp., Transistor Test Fixture (TTF) MT950 Series, May 31, 1995, Advanced Data, 4T-0011.

Cascade Microtech, "Layout rules for WPH-900 Series probes," Applications Note, 1996.

Cascade Microtech, "Air coplanar Probe Series," 1997.

Yong-Dae, Kim, et al. "Fabrication of silicon Micro-Probe for Vertical Probe Card Application," Jpn. J. Appl. Phys. vol. 37, Part 1, No. 12B, Dec. 1998, pp. 7070-7073.

"A Broadband Microwave choke," Microwave Journal, Dec. 1999.

Cascade Microtech, "On-Wafer Test Solutions for State-of-the-Art Electro-Optical Components," 2001.

Purroy. F. et al., "New Theoretical Analysis of the LRRm Calibration Technique for Vector Network Analyzers," IEEE Transactions on Instrumentation and Measurement, vol. 50, No. 5, Oct. 2001, pp. 1307-1313.

"Laser Diode Test Solution," Oct. 9, 2002, http:/www.cascademicrotech.com/index.cfm/fuseaction/pg.view/pID/136.

Liang, Qingqing, et al., "Accurate AC Transistor Characterization to 110 GHz Using a New Four-port Self-Calibrated Extraction Technique," 2004 Topical Meeting on Silicon Monolitic Integrated Circuits in RF Systems, pp. 282-285.

Cascade Microwave, "Introducing the World's First Microwave Wafer Probing Equipment," 4 pages, 1983.

Malm, R.L. "Reduction of Stray Fields About SEM Samples," IBM Technical Disclosure Bulletin, vol. 21, No. 7, Dec. 1978 2 pages.

Kuhn, Nick, "Accurate and Automatic Noise Figure Measurements with Standard Equipment," Hewlett-Packard co., Inc., Stanford Park Division 1501 Page Mill Road, Palo Alto, CA 94304, 3 pages Conference: Technology Grow for the 80's. 1980 IEEE MTT-S International Microwave Symposium Digest, Washington, DC, May 28-30, 1980.

The Micromanipulator Company, data sheet, Double Sided Probing System, Jul. 2002, 2 pages.

International Search Report for PCT/US06/16238 mailed Feb. 28, 2007.

Written Opinion of the International Searching Authority for PCT/US06/16238, mailed Feb. 28, 2007.

Partial International Search Report for PCT/US2005/039561, mailed Mar. 21, 2006.

International Search Report for PCT/US2005/039561, mailed May 18, 2006.

Written Opinion of the International Searching Authority for PCT/US2005/039561, mailed May 18, 2006.

Mark S. Boguski and Martin W. McIntosh, "Biomedical informatics for proteomics," insight: review article, Nature 422, 233-237 (2003); doi:10.1038/nature01515.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate AC Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Wavequide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions on Microwave Theory and Techniques, vol. 46, No. 5, May 1998, pp. 536-542.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Insitute of Physics, pp. 1354-1356.

Cascade Microtech, "Probe Heads Care and cleaning of coaxial input microwave probes," Microwave Probe Care and Cleaning, Instruction Manual, Copyright 1990.

Bob Stengel, "Neutralized Differential Amplifiers using Mixed-Mode s-parameters," 2003 IEEE Radio Frequency Integrated Circuits Symposium, pp. 711-714.

Supplementary Search Report for European Patent Application No. 04 785 615.8-1524; mailed Jul. 22, 2010; pp. 1-4.

* cited by examiner

PROBE FOR TESTING A DEVICE UNDER TEST

CROSS-REFERENCE TO RELATED APPLICATIONS

This application is a continuation of U.S. patent application Ser. No. 11/975,476, filed Oct. 19, 2007, now U.S. Pat. No. 7,498,829; which is a continuation of U.S. patent application Ser. No. 11/888,957, filed Aug. 3, 2007, now U.S. Pat. No. 7,394,269; which is a continuation of U.S. patent application Ser. No. 11/391,895, filed Mar. 28, 2006, now U.S. Pat. No. 7,271,603, which is a continuation of U.S. patent application Ser. No. 10/445,174, filed May 23, 2003, now U.S. Pat. No. 7,057,404.

BACKGROUND OF THE INVENTION

The present invention relates to probe measurement systems for measuring the electrical characteristics of integrated circuits or other microelectronic devices at high frequencies.

There are many types of probing assemblies that have been developed for the measurement of integrated circuits and other forms of microelectronic devices. One representative type of assembly uses a circuit card on which the upper side are formed elongate conductive traces that serve as signal and ground lines. A central opening is formed in the card, and a needle-like probe tip is attached to the end of each signal trace adjacent the opening so that a radially extending array of downwardly converging needle-like tips is presented by the assembly for selective connection with the closely spaced pads of the microelectronic device being tested. A probe assembly of this type is shown, for example, in Harmon U.S. Pat. No. 3,445,770. This type of probing assembly, however, is unsuitable for use at higher frequencies, including microwave frequencies in the gigahertz range, because at such frequencies the needle-like tips act as inductive elements and because there are no adjoining elements present to suitably counteract this inductance with a capacitive effect in a manner that would create a broadband characteristic of more or less resistive effect. Accordingly, a probing assembly of the type just described is unsuitable for use at microwave frequencies due to the high levels of signal reflection and substantial inductive losses that occur at the needle-like probe tips.

In order to obtain device measurements at somewhat higher frequencies than are possible with the basic probe card system described above, various related probing systems have been developed. Such systems are shown, for example, in Evans U.S. Pat. No. 3,849,728; Kikuchi Japanese Publication No. 1-209,380; Sang et al. U.S. Pat. No. 4,749,942; Lao et al. U.S. Pat. No. 4,593,243; and Shahriary U.S. Pat. No. 4,727,319. Yet another related system is shown in Kawanabe Japanese Publication No. 60-223,138 which describes a probe assembly having needle-like tips where the tips extend from a coaxial cable-like structure instead of a probe card. A common feature of each of these systems is that the length of the isolated portion of each needle-like probe tip is limited to the region immediately surrounding the device-under-test in order to minimize the region of discontinuity and the amount of inductive loss. However, this approach has resulted in only limited improvement in higher frequency performance due to various practical limitations in the construction of these types of probes. In Lao et al., for example, the length of each needle-like tip is minimized by using a wide conductive blade to span the distance between each tip and the supporting probe card, and these blades, in turn, are designed to be arranged relative to each other so as to form transmission line structures of stripline type. As a practical matter, however, it is difficult to join the thin vertical edge of each blade to the corresponding trace on the card while maintaining precisely the appropriate amount of face-to-face spacing between the blades and precisely the correct pitch between the ends of the needle-like probe tips.

One type of probing assembly that is capable of providing a controlled-impedance low-loss path between its input terminal and the probe tips is shown in Lockwood et al. U.S. Pat. No. 4,697,143. In Lockwood et al., a ground-signal-ground arrangement of strip-like conductive traces is formed on the underside of an alumina substrate so as to form a coplanar transmission line on the substrate. At one end, each associated pair of ground traces and the corresponding interposed signal trace are connected to the outer conductor and the center conductor, respectively, of a coaxial cable connector. At the other end of these traces, areas of wear-resistant conductive material are provided in order to reliably establish electrical connection with the respective pads of the device to be tested. Layers of ferrite-containing microwave absorbing material are mounted about the substrate to absorb spurious microwave energy over a major portion of the length of each ground-signal-ground trace pattern. In accordance with this type of construction, a controlled high-frequency impedance (e.g., 50 ohms) can be presented at the probe tips to the device under test, and broadband signals that are within the range, for example, of DC to 18 gigahertz can travel with little loss from one end of the probe assembly to another along the coplanar transmission line formed by each ground-signal-ground trace pattern. The probing assembly shown in Lockwood et al. fails to provide satisfactory electrical performance at higher microwave frequencies and there is a need in microwave probing technology for compliance to adjust for uneven probing pads.

To achieve improved spatial conformance between the tip conductors of a probe and an array of non-planar device pads or surfaces, several high-frequency probing assemblies have been developed. Such assemblies are described, for example, in Drake et al. U.S. Pat. No. 4,894,612; Coberly et al. U.S. Pat. No. 4,116,523; and Boll et al. U.S. Pat. No. 4,871,964. The Drake et al. probing assembly includes a substrate on the underside of which are formed a plurality of conductive traces which collectively form a coplanar transmission line. However, in one embodiment shown in Drake et al., the tip end of the substrate is notched so that each trace extends to the end of a separate tooth and the substrate is made of moderately flexible nonceramic material. The moderately flexible substrate permits, at least to a limited extent, independent flexure of each tooth relative to the other teeth so as to enable spatial conformance of the trace ends to slightly non-planar contact surfaces on a device-under-test. However, the Drake et al. probing assembly has insufficient performance at high frequencies.

With respect to the probing assembly shown in Boll et al., as cited above, the ground conductors comprise a pair of leaf-spring members the rear portions of which are received into diametrically opposite slots formed on the end of a miniature coaxial cable for electrical connection with the cylindrical outer conductor of that cable. The center conductor of the cable is extended beyond the end of the cable (i.e., as defined by the ends of the outer conductor and the inner dielectric) and is gradually tapered to form a pin-like member having a rounded point. In accordance with this construction, the pin-like extension of the center conductor is disposed in spaced apart generally centered position between the respective forward portions of the leaf-spring members and thereby forms, in combination with these leaf-spring members, a rough approximation to a ground-signal-ground coplanar transmission line structure. The advantage of this particular construction is that the pin-like extension of the cable's center conductor and the respective forward portions of the leaf-spring members are each movable independently of each other so that the ends of these respective members are able to establish spatially conforming contact with any non-planar contact areas on a device being tested. On the other hand, the transverse-spacing between the pin-like member and the respective leaf-spring members will vary depending on how forcefully the ends of these members are urged against the contact pads of the device-under-test. In other words, the transmission characteristic of this probing structure, which is dependent on the spacing between the respective tip members, will vary in an ill-defined manner during each probing cycle, especially at high microwave frequencies.

Burr et al., U.S. Pat. No. 5,565,788, disclose a microwave probe that includes a supporting section of a coaxial cable including an inner conductor coaxially surrounded by an outer conductor. A tip section of the microwave probe includes a central signal conductor and one or more ground conductors generally arranged normally in parallel relationship to each other along a common plane with the central signal conductor so as to form a controlled impedance structure. The signal conductor is electrically connected to the inner conductor and the ground conductors are electrically connected to the outer conductor, as shown in FIG. 1. A shield member is interconnected to the ground conductors and covers at least a portion of the signal conductor on the bottom side of the tip section. The shield member is tapered toward the tips with an opening for the tips of the conductive fingers. The signal conductor and the ground conductors each have an end portion extending beyond the shield member and the end portions are able to resiliently flex, despite the presence of the shielding member, relative to each other and away from their common plane so as to permit probing devices having non-planar surfaces.

In another embodiment, Burr et al. disclose a microwave probe that includes a supporting section of a coaxial cable including an inner conductor coaxially surrounded by an outer conductor, as shown in FIGS. 2A, 2B, and 2C. A tip section of the microwave probe includes a signal line extending along the top side of a dielectric substrate connecting a probe finger with the inner conductor. A metallic shield may be affixed to the underside of the dielectric substrate and is electrically coupled to the outer metallic conductor. Ground-connected fingers are placed adjacent the signal line conductors and are connected to the metallic shield by way of vias through the dielectric substrate. The signal conductor is electrically connected to the inner conductor and the ground plane is electrically connected to the outer conductor. The signal conductor and the ground conductor fingers (connected to the shield via vias) each have an end portion extending beyond the shield member and the end portions are able to resiliently flex, despite the presence of the shielding member, relative to each other and away from their common plane so as to permit probing devices having non-planar surfaces. While the structures disclosed by Burr et al. are intended to provide uniform results of a wide frequency range, they unfortunately tend to have non-uniform response characteristics at high microwave frequencies.

The foregoing and other objectives, features, and advantages of the invention will be more readily understood upon consideration of the following detailed description of the invention, taken in conjunction with the accompanying drawings.

DETAILED DESCRIPTION OF PREFERRED EMBODIMENT

The present inventors considered the co-planar fingered probing devices disclosed by Burr et al., including the co-planar finger configuration and the microstrip configuration with fingers extending therefrom. In both cases, electromagnetic fields are created during probing between the fingers. These electromagnetic fields encircle each of the fingers, electrically couple the signal finger to the ground fingers, and electrically couple the ground fingers one another. While the probing device is being used for probing, the resulting electromagnetic fields surrounding the fingers interact with the wafer environment. While probing in different regions of the wafer, the interaction between the electromagnetic fields around the fingers and the wafer change, typically in an unknown manner. With a significant unknown change in the interaction it is difficult, if not impossible, to accurately calibrate out the environmental conditions while probing a device under test.

When multiple probes are being simultaneously used for probing the same area of the wafer, the probe tips come into close proximity with one another and result in additional coupling between the probes, normally referred to as crosstalk. In addition, the region between the support for the fingers, such as a dielectric substrate, and the extended portion of the fingers results in a significant capacitance, which impedes high frequency measurements.

The present inventors were surprised to determine that the microstrip structure disclosed by Burr et al. further does not calibrate well on calibration test substrates at very high frequencies, such as in excess of 70 GHz. This calibration is independent of potential interaction with a wafer at a later time during actual probing of a device under test. After examination of this unexpected non-calibration effect the present inventors speculate that an energy is created in an "undesired mode", other than the dominant field modes, at such extreme frequencies. This "undesired mode" results in unexpected current leakages from the signal path thus degrading the signal integrity. The present inventors further speculate that this "undesired mode" involves resonating energy in the ground plane as a result of discontinuities in the ground path, including for example, the connection between the ground plane and the external portion of the cable, and the inductance in the ground plane. This ground plane resonant energy results in unpredictable changing of the energy in the signal path to the device under test, thus degrading performance. This degradation wasn't apparent at lower operating frequencies, so accordingly, there was no motivation to modify existing probe designs in order to eliminate or otherwise reduce its effects.

Figure 1:
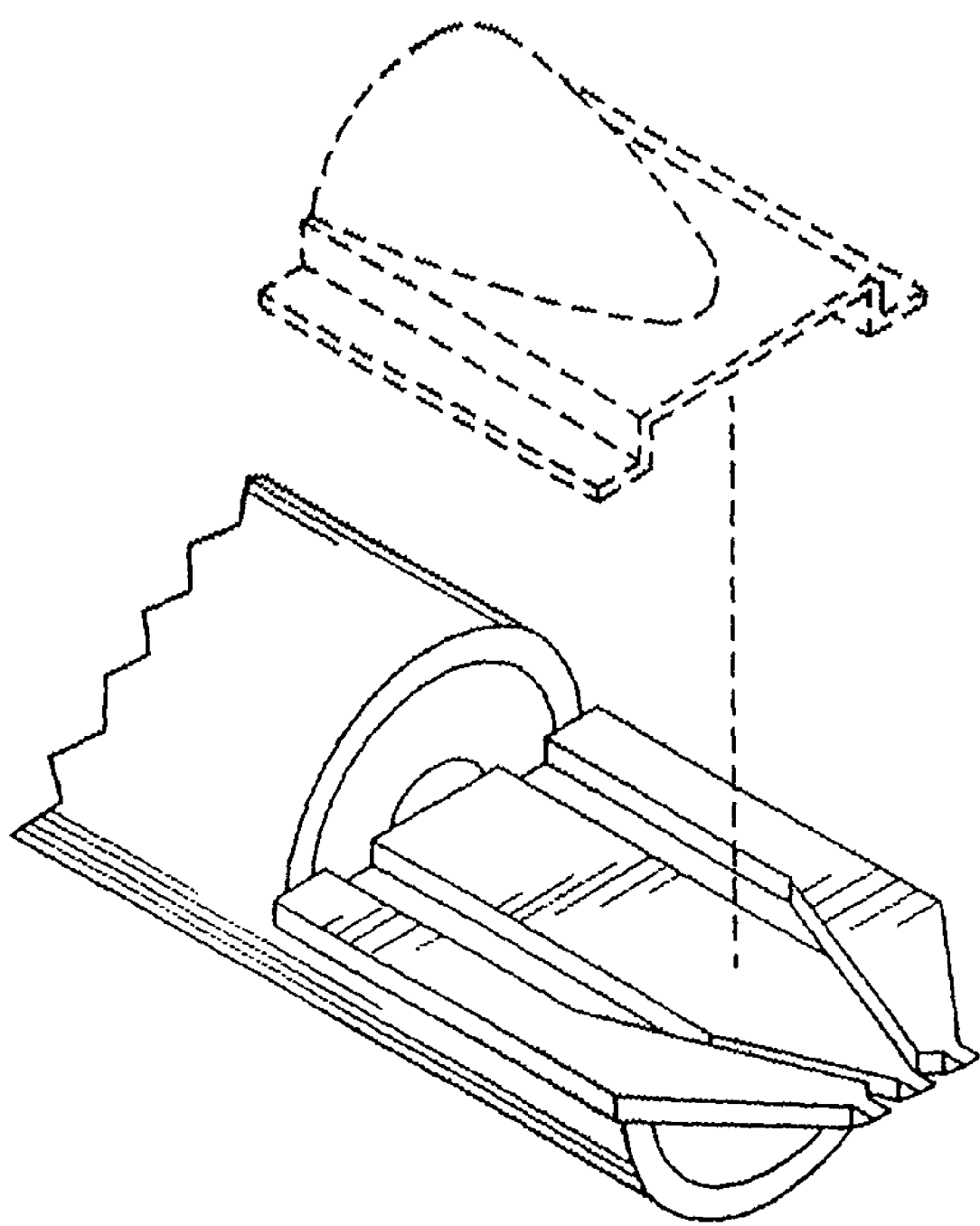
FIG. 1 illustrates an existing probe.
Figure 2A:
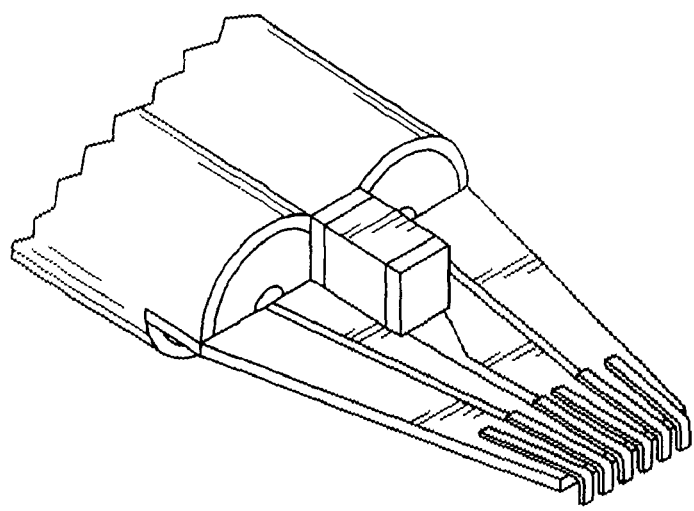
FIGS. 2A-2C illustrate another existing probe.
Figure 2B:
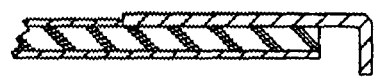
Figure 2C:
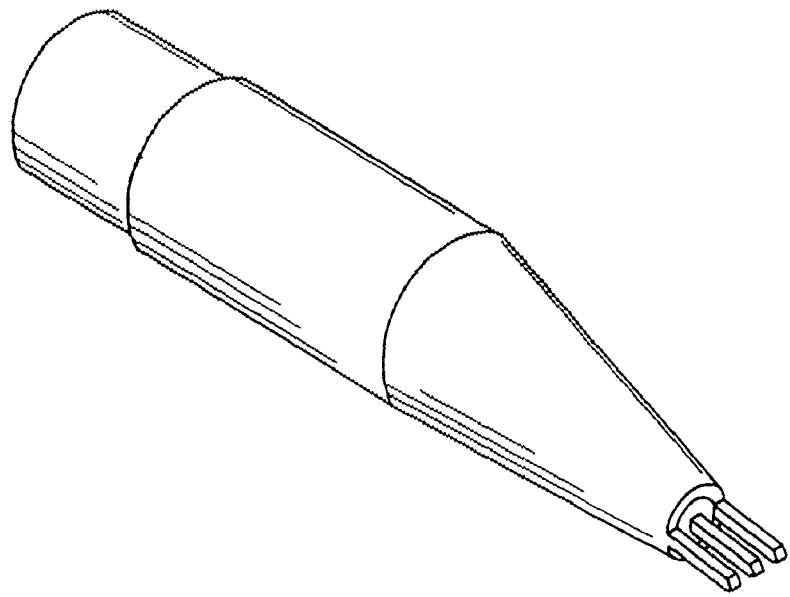
Figure 3:
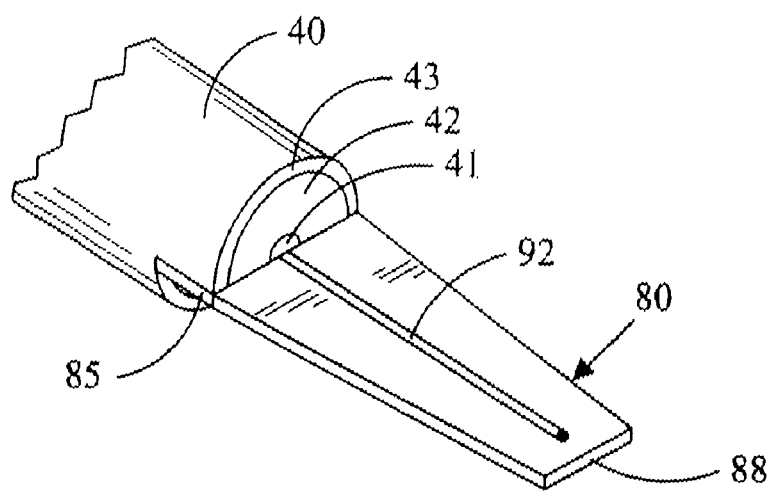
FIG. 3 illustrates one embodiment of a probe.

Referring to FIG. 3, a semi-rigid coaxial cable 40 is electrically connected at its rearward end to a connector (not shown). The coaxial cable 40 normally includes an inner conductor 41, a dielectric material 42, and an outer conductor 43. The coaxial cable 40 may likewise include other layers of materials, as desired. The forward end of the cable 40 preferably remains freely suspended and, in this condition, serves as a movable support for the probing end of the probe.

Figure 4:
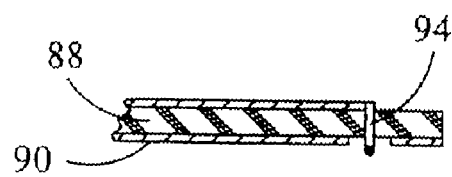
FIG. 4 illustrates a side view of a portion of the probe of FIG. 3.

A microstrip style probe tip 80 includes a dielectric substrate 88 that is affixed to the end of the coaxial cable 40. The underside of the cable 40 is cut away to form a shelf 85, and the dielectric substrate 88 is affixed to the shelf 85. Alternatively, the dielectric substrate 88 may be supported by an upwardly facing shelf cut away from the cable or the end of the cable without a shelf. Referring also to FIG. 4, a conductive shield 90, which is preferably planar in nature, is affixed to the bottom of the substrate 88. The conductive shield 90, may be for example, a thin conductive material (or otherwise) that is affixed to the substrate 88. By using a generally planar conductive material having a low profile the shield 90 is less likely to interfere with the ability to effectively probe a device under test by accidently contacting the device under test. The conductive shield 90 is electrically coupled to the outer conductor 43 to form a ground plane. The other conductor 43 is typically connected to the ground, though the outer conductor 43 may be provided with any suitable voltage potential (either DC or AC). The conductive shield 90 preferably covers all of the lower surface of the substrate 88. Alternatively, the conductive shield 90 may cover greater than 50%, 60%, 70%, 80%, 90%, and/or the region directly under a majority (or more) of the length of a conductive signal trace on the opposing side of the substrate 88.

One or more conductive signal traces 92 are supported by the upper surface of the substrate 88. The conductive traces 92, may be for example, deposited using any technique or otherwise supported by the upper surface of the substrate. The conductive trace(s) 92 is electrically interconnected to the inner conductor 41 of the coaxial cable 40. The inner conductor 41 of the coaxial cable 40 and the conductive trace(s) 92 normally carries the signal to and from the device under test. The conductive trace(s) 92 together with the shield layer 90 separated by a dielectric material 88 form one type of a microstrip transmission structure. Other layers above, below, and/or between the shield layer 90 and the conductive trace 92 may be included, if desired.

To reduce the effects of the aforementioned unexpected high frequency signal degradation, the present inventors determined that the signal path may include a conductive via 94 passing through the substrate 88. The conductive via 94 provides a manner of transferring the signal path from the upper surface of the substrate to the lower surface of the substrate. The conductive via 94 avoids the need for using a conductive finger extending out from the end of the substrate 88 that would otherwise result in a significant capacitance between the extended finger and the end of the substrate 88. The conductive via 94 provides a path from one side of the substrate 88 to the other side of the substrate 88 in a manner free from an air gap between the conductive via 94 and the substrate 88 for at least a majority of the thickness of the substrate 88. In addition, the shield layer 90 preferably extends beyond the via 94 to provide additional shielding.

Figure 5:
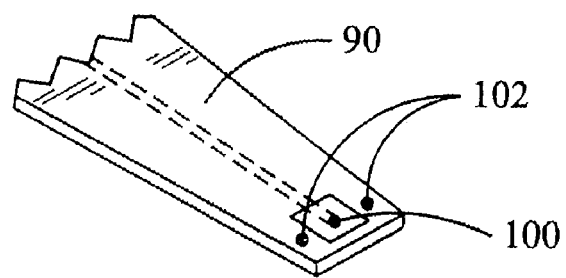
FIG. 5 illustrates a bottom view of a portion of the probe of FIG. 3.

Referring also to FIG. 5, the lower surface of the substrate 88 illustrates a contact bump 100 electrically connected to the via 94 and the trace 92 extending below the lower surface of the substrate 88 and the shield 90 which may be used to make contact with the device under test during probing. The conductive shield 90 may include an "patterned" section around the contact "bump" 100 so that the shield layer 90 and the signal path are free from being electrically interconnected (e.g., the shield layer 90 may be greater than 50%, 75%, or laterally surrounding all of the contact at some point). It is to be understood that the contact may take any suitable form, such as for example a bump, a patterned structure, a conductive structure, a needle structure, or an elongate conductor. The conductive shield 90 may laterally encircle the conductive bump which increases the resistance to external electromagnetic fields. Also, the conductive shield 90 extending beyond the conductive bump 100 reduces the crosstalk from other probes. For some probing applications, one or more shield 90 contacts 102 may be provided, if desired. The shield layer and the conductive trace are normally constructed to provide a microstrip transmission line controlled impedance structure. While typically the signal line has a test signal and the shield has a ground potential, the two conductive paths may likewise be any other configuration, such as balanced inputs which vary with respect to ground.

Figure 6:
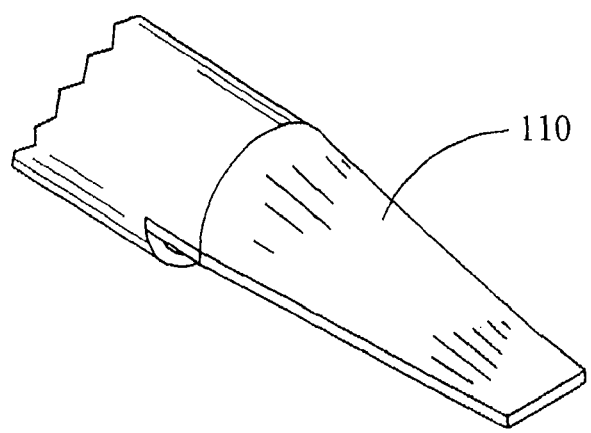
FIG. 6 illustrates another embodiment of a probe.

Referring to FIG. 6, the probe may employ an outer cone shaped upper shield 10. The outer conductor 43 of the coaxial cable is connected to the upper shield 110 is therefore electrically connected to ground. This design provides a smooth transition between the coaxial cable and the end of the probe. The probe is therefore shielded as it transitions to the tip of the cone portion.

The upper shield 10 has a tapered cylindrical portion whose forward end is a tapered tip and whose rear end has a contour that is in continuous contact with the outer coaxial conductor along its circumference so that there is no gap between the outer conductor and portions of the shield that could create fringing fields that could effect probe measurements. Likewise, any other shape may be used for the shield 110, as desired. In addition, the forward end preferably extends past the via and forms a substantially closed region so that there is reduced fringing fields at the forward end. The shield reduces parasitic coupling to any external structure and the construction of the shield as a single piece of metal reduces complexity of assembly. The shield is preferably made of a thin foil and is capable of being formed by a fabrication process. The shield may also be deposited or made of other material.

The lower shield member 90 extends underneath the conductive trace between the fingers and the chuck holding the device under test. The shield therefore helps to block the generation of ground plane resonant modes that can otherwise interfere with and degrade the signal from the device under test.

Figure 7:
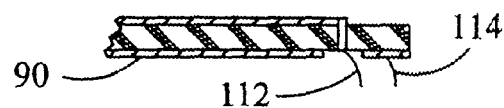
FIG. 7 illustrates yet another embodiment of a probe.

Referring to FIG. 7, in an alternative embodiment a conductive finger 112 or other elongate conductive element may be provided that is electrically interconnected to the via. One or more additional ground fingers 114 may be electrically connected to the lower shield material. If desired, each respective finger may include a cantilevered portion that extends down away from the substrate. The cantilevered portions are preferably arranged in transversely spaced apart relationship to each other so as to cooperatively form a controlled impedance transmission line in order that a low loss transition can be made between the respective conductors on the cable and the respective pads on the device-under test.

While the use of an upper shield 110 that includes a curved surface provides an improvement to signal integrity, the changes in the structure of the upper shield tend to introduce some limitations into the signal integrity at high frequencies, thus impeding performance. For example, the changes in the height of the upper shield changes the electromagnetic field pattern along the length of the signal conductor. In addition, increased manufacturing complexity occurs with the upper shield. Furthermore, in most cases microwave microstrip transmission structures are enclosed in a housing, such as a conductive case, and accordingly there is reduced motivation to include an upper shield structure.

To further increase the performance at high frequencies the present inventors considered the effects of the substrate material. In many cases the dielectric constant of the dielectric substrate material is high, such as $Al_2O_3$ which has a 9.9 dielectric constant. Materials with a high dielectric constant have a tendency to concentrate the electromagnetic fields therein, thus decreasing the electromagnetic fields susceptible to influence by other devices. In addition, the thickness of the substrate is typically 250-500 microns to provide mechanical stability. Thus the fields tend to concentrate within the substrate.

Figure 8:
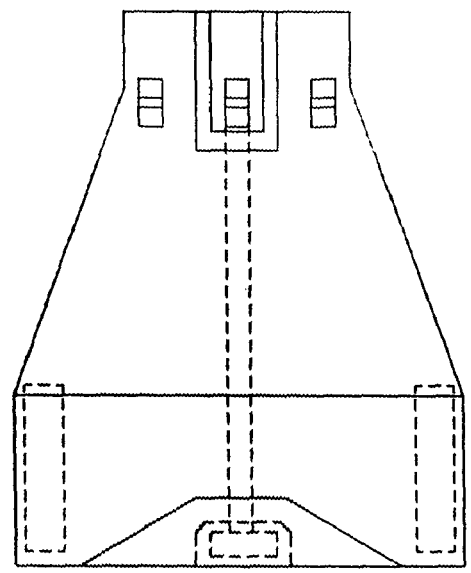
FIG. 8 illustrates still another embodiment of a probe.

Referring to FIG. 8, while considering such substrates the present inventors came to the realization that the flexible membrane substrate may be substituted for the more rigid substrate 88. An example of membrane material is described in U.S. Pat. No. 5,914,613, incorporated by reference herein together will all other references cited herein incorporated by reference herein. In general, membrane based probes are characterized by a flexible (or semi-flexible) substrate with traces supported thereon together with contacting portions being supported thereon. The membrane portion of the probe may be constructed from a sacrificial substrate into which is created a depression. Into this depression is located conductive material, traces are located thereon if desired, and flexible dielectric material is located on or under the traces. Thereafter, the sacrificial substrate is removed leaving the probe tip, traces, and membrane material. The contacting portions come into contact with the device under test and the traces are normally on the opposing side of the membrane connected to the contacting portions using vias. In many cases, the membrane technology may be significantly thinner than ceramic based substrates, (see, e.g., substrate 88) such as 40, 30, 20, 10, 5, or 3 microns or less. Normally the dielectric constant of the membrane material is 7 or less, sometimes less than 6, 5, or 4 depending on the particular material used. While normally using a lower dielectric constant substrate is unsuitable, using a significantly thinner substrate together with a lower dielectric constant substrate raises the theoretical frequency range of effective signal transmission to 100's of GHz. The significantly thinner substrate material permits positioning the lower shield material significantly closer to the signal traces than the relatively thick ceramic substrate, and therefore tends to more tightly confine the electromagnetic fields there between. With a tight confinement of the electric fields in the membrane material, the present inventors determined that the high frequency performance of the membrane material may be increased by locating an upper shield material above the membrane material. Moreover, the upper shield material should likewise be correspondingly close to the signal path, so the curved upper shield material positioned at a significant distance from the signal trace previously used may not normally be sufficient. Accordingly, the shield material should be patterned on the top of the membrane material with a dielectric between the signal trace and the upper shield material. In many cases, the distance between the signal trace and the upper shield directly above the signal trace should be no more than 10 times the distance between the signal trace and the lower shield material. More preferably, the aforementioned distance would be preferably 7, 5, 4, or 2 times.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A probe comprising:
   (a) a dielectric substrate having a pair of opposing major surfaces;
   (b) an elongate conductor suitable to be electrically interconnected to a test signal supported by said substrate;
   (c) a conductive member suitable to be electrically interconnected to a ground signal supported by said substrate wherein said conductive member together with said elongate conductor form a controlled impedance transmission structure;
   (d) a conductive path between a first side of said substrate and a second side of said substrate in a manner free from an air gap between the conductive path and an edge of said substrate for at least a majority of the thickness of said substrate and said conductive path free from electrical interconnection with said conductive member; and
   (e) a contact electrically interconnected to said conductive path for testing a device under test.

2. The probe of claim 1 wherein said controlled impedance transmission structure is microstrip.

3. The probe of claim 1 wherein said edge is a via through said substrate.

4. The probe of claim 1 wherein said edge is an exterior peripheral edge of said substrate.

5. The probe of claim 1 wherein said elongate conductor is electrically interconnected to a central conductor of a coaxial cable.

6. The probe of claim 5 wherein said conductive member is electrically connected to a conductor surrounding said central conductor of said coaxial cable.

7. The probe of claim 6 wherein said substrate is supported by said coaxial cable.

8. The probe of claim 7 wherein said substrate is supported by a shelf of said coaxial cable.

9. The probe of claim 1 wherein said conductive member is substantially planar.

10. The probe of claim 1 wherein said dielectric substrate is semi-flexible.

11. The probe of claim 10 wherein said dielectric substrate is a membrane.

12. The probe of claim 1 wherein said dielectric substrate has a dielectric constant less than 7.

13. The probe of claim 1 wherein said dielectric substrate has a dielectric constant less than 5.

14. The probe of claim 1 wherein said dielectric substrate has a dielectric constant less than 4.

15. The probe of claim 1 wherein said dielectric substrate has a dielectric constant less than 2.

16. The probe of claim 1 wherein said ground signal is zero volts.

17. The probe of claim 1 wherein said conductive member covers greater than 50% of said second side of said substrate.

18. The probe of claim 1 wherein said conductive member covers greater than 60% of said second side of said substrate.

19. The probe of claim 1 wherein said conductive member covers greater than 70% of said second side of said substrate.

20. The probe of claim 1 wherein said conductive member covers greater than 80% of said second side of said substrate.

21. The probe of claim 1 wherein said conductive member covers greater than 90% of said second side of said substrate.

22. The probe of claim 1 wherein said conductive member, said elongate conductor, and said substrate collectively form a microstrip transmission structure.

23. The probe of claim 1 wherein said conductive member laterally surrounds at least 50% of said contact.

24. The probe of claim 1 wherein said conductive member laterally surrounds at least 75% of said contact.

25. The probe of claim 1 wherein said conductive member laterally surrounds at least 100% of said contact.

26. The probe of claim 1 wherein said contact is in the form of a bump.

27. The probe of claim 1 wherein said substrate has a thickness less than 40 microns.

28. The probe of claim 1 wherein said substrate has a thickness less than 30 microns.

29. The probe of claim 1 wherein said substrate has a thickness less than 20 microns.

* * * * *